(12) United States Patent
Sunkara et al.

(10) Patent No.: US 7,445,671 B2
(45) Date of Patent: *Nov. 4, 2008

(54) FORMATION OF METAL OXIDE NANOWIRE NETWORKS (NANOWEBS) OF LOW-MELTING METALS

(75) Inventors: Mahendra Kumar Sunkara, Louisville, KY (US); Shashank Sharma, Mountain View, CA (US); Burtron H. Davis, Georgetown, KY (US); Uschi M. Graham, Lexington, KY (US)

(73) Assignees: University of Louisville, Louisville, KY (US); University of Kentucky, Lexington, KY (US)

( * ) Notice: Subject to any disclaimer, the term of this patent is extended or adjusted under 35 U.S.C. 154(b) by 301 days.

This patent is subject to a terminal disclaimer.

(21) Appl. No.: 10/869,489
(22) Filed: Jun. 16, 2004

(65) Prior Publication Data

US 2007/0209576 A1    Sep. 13, 2007

Related U.S. Application Data

(63) Continuation-in-part of application No. 10/664,072, filed on Sep. 16, 2003, now Pat. No. 7,182,812, and a continuation-in-part of application No. 10/187,460, filed on Jul. 1, 2002, now Pat. No. 7,252,811, and a continuation-in-part of application No. 09/896,834, filed on Jun. 29, 2000, now Pat. No. 6,806,228.

(60) Provisional application No. 60/478,788, filed on Jun. 16, 2003, provisional application No. 60/478,793, filed on Jun. 16, 2003.

(51) Int. Cl.
    *C30B 21/02* (2006.01)
(52) U.S. Cl. .......................... 117/40; 117/45; 117/50; 117/84; 117/85; 117/86
(58) Field of Classification Search ............. 117/40, 117/45, 50, 84, 85, 86
    See application file for complete search history.

(56) References Cited

U.S. PATENT DOCUMENTS 6,806,228 B2 * 10/2004 Sharma et al. ............. 502/439
7,182,812 B2 * 2/2007 Sunkara et al. ............. 117/103
2004/0150100 A1 * 8/2004 Dubin et al. ............... 257/720

OTHER PUBLICATIONS

B. Messer, J.H. Song, M. Huang, Y.Y.Wu, F.Kim, P.D.Yang, "Surfactant-Inducedmesoscopic Assemblies of Inorganic Molecular Chains" (See Attached Sheet).

(Continued)

*Primary Examiner*—Robert M Kunemund
(74) *Attorney, Agent, or Firm*—Carrithers Law Office, PLLC; David W. Carrithers

(57) ABSTRACT

A method of producing networks of low melting metal oxides such as crystalline gallium oxide comprised of one-dimensional nanostructures. Because of the unique arrangement of wires, these crystalline networks defined as "nanowebs", "nanowire networks", and/or "two-dimensional nanowires". Nanowebs contain wire densities on the order of $10^9/cm^2$. A possible mechanism for the fast self-assembly of crystalline metal oxide nanowires involves multiple nucleation and coalescence via oxidation-reduction reactions at the molecular level. The preferential growth of nanowires parallel to the substrate enables them to coalesce into regular polygonal networks. The individual segments of the polygonal network consist of both nanowires and nanotubules of β-gallium oxide. The synthesis of highly crystalline noncatalytic low melting metals such as β-gallium oxide tubes, nanowires, and nanopaintbrushes is accomplished using molten gallium and microwave plasma containing a mixture of monoatomic oxygen and hydrogen. Gallium oxide nanowires were 20-100 nm thick and tens to hundreds of microns long. Transmission electron microscopy (TEM) revealed the nanowires to be highly crystalline and devoid of any structural defects. Results showed that multiple nucleation and growth of gallium oxide nanostructures can occur directly out of molten gallium exposed to appropriate composition of hydrogen and oxygen in the gas phase. The method of producing nanowebs is extendible to other low melting metals and their oxides such as for example: zinc oxide, tin oxide, aluminum oxide, bismuth oxide, and titanium dioxide.

71 Claims, 19 Drawing Sheets

OTHER PUBLICATIONS

Y.Y. Wu, H.Q. Yan, M. Huang, B. Messer, J.H. Song, P.D. Yang, "Inorganic Semiconductor Nanowires: Rational Growth, Assembly, and Novel Properties" (See Attached Sheet).

D.R.S. Cumming, S. Thomas, S.P. Beaumont, J.M.R. Weaver, "Fabrication of 3 NM Wires . . . and Poly(Methl Methacrylate)Resist" (See AttachedSheet).

M.F. Crommie, C.P. Lutz, D.M. Eigler, "Confinement of Electrons to Quantum Corrals on a Metal Surface" (See AttachedSheet).

M. Paulose, C.A. Grimes, O.K. Varghese, E.C. Dickey, "Self-Assembled Fabrication of Aluminum-Silicon Nanowire Networks" (See AttachedSheet).

M. Paulose, O.K. Varghese, C.A. Grimes, "Fabrication of Nanoporous Ceramic Thin Films" (See AttachedSheet).

J. Erlebacher, M.J. Aziz, A. Karma, N. Dimitrov, K. Sieradzki, "Evolution of Nanoporosity in Dealloying" (See AttachedSheet).

L. Adelung, L. Kipp, H. Brandt, L. Tarak, M. Traving, C. Kreis, M. Skibowski, "Nanowire Networks on Perfectly Flat Surfaces" (See AttachedSheet).

K-W Chang, S-C Liu, L.Y. Chen, F.C-N Hong, J-J. Wu, "Catalyst-Free growth of Large Scale Ga2O3 Nanowires" (See AttachedSheet).

S.T. Lee, Y.F. Zhang, N. Wang, Y.H. Tang, I. Bello, C.S. Lee, Y.W. Chung, "Semiconductor Nanowires From Oxides" (See AttachedSheet).

W.Q. Han, P. Kohler-Redlich, F. Ernst, M. Ruhle, "Growth and Microstructure of Ga2O3 Nanorods" (See AttachedSheet).

L. Binet, D. Gourier, "Origin of Blue Luminescence of Ga2O3" (See AttachedSheet).

J.H. Song, Y.Y. Wu, B. Messer, H. Kind, P.D. Yang, "Metal Nanowire Formation Using Mo3Se3- as Reducing and Sacrificing Templates" (See AttachedSheet).

C.H. Liang, G.W. Meng, G.Z. Wang, Y.W. Wang, L.D. Zhang, S.Y. Zhang, "Catalytic Synthesis and Photoluinescence of Ga2O3 Nanowires" (See AttachedSheet).

M. Fleischer, L. Hollbauer, E. Born, H. Meixner, "Evidence for a Phase Transition of Gallium Oxide at Very Low Oxygen Pressures" (See AttachedSheet).

T. Miyata, T. Nakatani, T. Minami, "Gallium Oxide as Host Material for Multicolor Emitting Phosphors" (See AttachedSheet).

Z.R. Dai, Z. W. Pan, Z.L. Wang, "Gallium Oxide Nanoribbons and Nanosheets" (See Attached Sheet).

W.C. Wu, W.H. Song, W.D. Huang, M. H. Pu, B. Zhao, Y.P. Sun, J. Du, "Crystalline Gallium Oxide Nanowires: Intensive Blue Light Emitters" (See AttachedSheet).

R.L. Penn, J.F. Banfield, "Imperfect Oriented Attachment: Dislocation Generation in Defect-Free Nanocrystals" (See AttachedSheet).

M.J. Regan, H. Tostmann, P.S. Pershan, "X-Ray Study of the Oxidation of Liquid-Gallium Surfaces" (See AttachedSheet).

Y. Wu, H. Yan, P. Yang, "Semiconductor Nanowire Array: Potential Substrates for Photocatalysis and Photovoltaics" (See AttahcedSheet).

S. Sharma, M.K. Sunkara, "Direct Synthesis of Gallium Oxide Tubes, Nanowires, and Nanopaint Brushes" (See AttachedSheet).

M.K. Sunkara, S. Sharma, R. Miranda, G. Lian, E.C. Dickey, "Bulk Synthesis of Silicon Nanowires Using a Low-Temperature Vapor-Liquid-Solid Method" (See AttachedSheet).

R. Tenne, "Inorganic Nanoclusters with Fullerene-Like Stucture and Nanotubes," (See AttachedSheet).

\* cited by examiner

FORMATION OF METAL OXIDE NANOWIRE NETWORKS (NANOWEBS) OF LOW-MELTING METALS

This is a Continuation in Part application claiming priority from U.S. Pat. No. 7,182,812 issued on Feb. 27, 2007 from application Ser. No. 10/664,072 filed on Sep. 16, 2002 and U.S. Pat. No. 7,252,811 issued on Aug. 7, 2007 from Ser. No. 10/187,460 filed on Jul. 1, 2002 and U.S. Pat. No. 6,806,228 issued on Oct. 19, 2004 from Ser. No. 09/896,834 filed on Jun. 29, 2000 and provisional application Ser. No. 60/478,788 filed on Jun. 16, 2003 and Ser. No. 60/478,793 filed on Jun. 16, 2003. all of which are hereby incorporated by reference herein.

This application is part of a government project. The research leading to this invention was supported from the Commonwealth of Kentucky, from a NSF for CAREER grant (CTS 9876251) and U.S. Air Force grant through AFOSR F 49620-00-1-0310. The United States Government retains certain rights in this invention.

BACKGROUND OF THE INVENTION

1. Field of the Invention

The invention relates to the field of providing a method of producing networks of crystalline low melting metal oxides comprised of one-dimensional nanostructures such as nanotubes and nanowires in an arrangement of wires forming crystalline networks defined as "nanowebs", "nanowire networks", and/or "two-dimensional nanowires" containing wire densities on the order of $10^9/cm^2$.

2. Description of the Prior Art

Nanostructures find unique applications in electronics, optoelectronics, and catalysis due to their high surface to volume ratio, enhanced material characteristics due to quantum confinement effects and the high fraction of chemically similar surface sites. Functionalization of these nanostructures can only be achieved and become useful through the synthesis of bulk quantities of defined structures with controlled composition, crystallinity and morphology. Gallium oxide, for example, is a wide-bandgap material and is of interest due to its interesting bulk properties such as conduction and luminescence. These properties make it a candidate for gas sensing, catalytic, and optoelectronic device applications. Nanostructures of gallium oxide will be of particular interest for these applications.

Gallium oxide ($Ga_2O_3$) is a wide-bandgap semiconductor with a band gap of 4.9 eV at room temperature. In the form of nanowires, $Ga_2O_3$ emits blue light, and when activated with manganese, can act as an electroluminescent phosphor. Polycrystalline $Ga_2O_3$ thin films are excellent sensors for oxygen (at temperatures, T>850° C.) and reducing gases (T<900° C.). One-dimensional (1-D) nanostructures of $Ga_2O_3$ have traditionally been produced by arc discharge, laser ablation, chemical vapor deposition, chemical transport reactions, and thermal evaporation. Nano-wires, -rods, -belts and -ribbons, are among the diverse one dimensional structures. Their growth has been attributed to either the catalytically assisted vapor-liquid-solid (VLS) process, the vapor-solid (VS) process, or a combination of the two.

More particularly, gallium oxide nanowires have been synthesized using techniques such as physical evaporation, arc discharge, and catalyst assisted methods. All of these techniques have been thought to proceed according to two primary mechanisms. The first mechanism involves carbothermal reduction of gallium oxide to produce gas phase gallium suboxide growth species. The second mechanism relies on transition metal catalyst or evaporated gallium clusters to provide the necessary template for size control of the resulting nanowires.

Although nanoscale metal oxide networks have been fabricated previously, the current techniques produce porous, amorphous, web-like structures. Up until now, only advanced tools such as electron beam lithography were able to assemble nanostructures, by selectively transferring nano-building blocks, or by surfactant induced mesoscopic organization, and redox templating synthesis of inorganic metal wires. However, these tools are still too slow and cost-prohibitive for the assembly of large-area networks of nanomaterials for device fabrication.

The present invention provides a process for rapid self-assembly of low melting metals and/or their oxides, such as gallium oxide ($Ga_2O_3$) nanowires into a network. These are not precise nano-structures, but unlike fractal networks, the $Ga_2O_3$ nanowires will be shown to intersect and form webs parallel to the substrate. The two-dimensional, polygonal arrangement of wires is unique. The growth mechanism of these low melting metal oxides to form gallium oxide nanowebs is provided as an example and is extendible to other low melting metals and their oxides such as for example: zinc oxide, tin oxide, aluminum oxide, bismuth oxide, and titanium dioxide.

SUMMARY OF THE INVENTION

Two-dimensional networks of nanowires and nanotubes of β-$Ga_2O_3$ were obtained using hydrogen/oxygen plasma exposure of gallium droplets covered substrate. Multiple nucleation and growth of one dimensional structures from the gallium droplets parallel to the substrate coalesced to yield the crystalline network. Because of the unique regular arrangement of nanowires in a polygonal fashion, these crystalline networks are described as 'nanowebs'. The molecular arrangement of the $Ga_2O_3$ nanowires/nanotubules suggests that key electrical properties be associated with these structures. The formation mechanism and evolution of $Ga_2O_3$ nanowebs suggests that this process could be easily extended to other low melting metal oxides such as $SnO_2$, ZnO and $In_2O_3$ etc.

The present invention provides a process of synthesizing low melting metal nanowebs, comprising: forming a catalytic metal on a substrate; placing the combination in a pressure chamber; adding gaseous reactant such as hydrogen and oxygen; applying sufficient microwave energy to raise the temperature in the chamber to a point above the melting point of the metal and continuing the process forming a of thin film with nm-sized $Ga_{(l)}$ droplets; decreasing the surface tension of $Ga_{(l)}$ droplets in the mixed plasma, allowing the metal to wet the substrate surface whereby forming flattened Ga discs; re-oxidation of $Ga_{(l)}$ in the presence of reactive H/O-Pl and preferential growth of nanowires from Ga discs parallel to the substrate; molecular assembly into nanotubular structures; and spatial guidance of nanowires to grow toward each other.

Low melting metals (for example, gallium) provide the solvent medium for bulk nucleation and growth of nanowires, thereby eliminating the need for transition metal clusters as growth templates. Large droplets (millimeter size) or thin gallium films are spread on substrates to initiate nucleation with densities greater than $10^{11}/cm^2$. The large number density of the resulting nanowires makes the technique suitable and interesting for large-scale production. The gas phase chemistry can be used to manipulate the absolute size, composition, and crystallinity of the nanowires. The only requirement is that the materials of interest should have extremely low solubility and low wetting characteristics with respect to molten gallium. If the solute wets the molten metal then two-dimensional crystals (platelets) or three-dimensional crystals are more likely to result rather than one-dimensional crystals.

Molten gallium has been used as the growth medium for both silicon and carbon nanowires. As an example in the instant invention, bulk nucleation and growth of gallium oxide nanostructures are formed from molten gallium pools using a microwave oxygen plasma. This direct synthesis approach for producing oxide nanowires can be easily extended to other metals such as aluminum, indium, tin, and zinc and their oxides zinc oxide, tin oxide, aluminum oxide, bismuth oxide, and titanium dioxide. In addition, the instant invention provides a means for the synthesis of unique geometrical structures of crystalline gallium oxide.

The present invention provides a method for the synthesis of oxide nanowebs of low-melting metals with a specific example of a highly crystalline b-gallium oxide nanowire network using molten gallium and a microwave plasma based gas chemistry. Gallium oxide nanowires, 20-100 nm thick and tens to hundreds of microns long were synthesized and confirmed to be crystalline and devoid of any structural defects using transmission electron microscopy. Multiple nucleation and growth of gallium oxide nanowires were obtained with appropriate gas phase composition of hydrogen and oxygen. Direct use of gallium melts in plasma environments allowed bulk synthesis with high nucleation densities and also allowed template-free synthesis of nanostructures with unique geometries. This plasma-based technique allowed for synthesis at temperatures much lower than conventional methods. The gas phase chemistry allowed manipulation of the nanostructure composition, structure, and morphology. Demonstration of this technique with gallium oxide presents a new route for synthesis of nanostructures of other important metal oxides such as indium oxide, tin oxide, and zinc oxide. Synthesis of unique geometrical structures of crystalline gallium oxide in the form of tubes and nanopaintbrushes has been developed.

Results show that multiple nucleation and growth of gallium oxide nanostructures occur directly out of molten gallium upon exposure to appropriate composition of hydrogen and oxygen in the gas phase. It is possible to present a growth model for the observed morphologies in the one-dimensional structures. Oxygen from the vapor phase forms surface adsorbed species on the molten metal surface. These oxygenated species dissolve into the molten metal followed by phase segregation to create multiple nuclei on the surface. In the absence of hydrogen in the plasma, these nuclei aggregate to form a polycrystalline crust on the molten metal surface. However hydrogen/oxygen chemistry enables nuclei segregation on the metal surface, preventing the complete crust formation. These nuclei grow in one dimension upon basal attachment of the bulk growth species. The surface dynamics of nuclei on the metal surface, i.e., pattern formation, and the time of coalescence determine the morphology of the resulting structure. Thus, results show that the gas phase chemistry allows manipulation of the nanostructure composition, structure, and morphology.

One preferred embodiment of the instant invention utilizes a synthesis technique was introduced and demonstrated with the nucleation and growth of multiple silicon nanowires from large pools of low melting metals such as gallium. The concept of multiple nanowire nucleation and growth was also demonstrated, beyond the elemental nanowires, with bulk synthesis of gallium oxide nanowires from large pools of molten gallium exposed to an activated gas phase containing oxygen precursors. The nucleation and growth of $Ga_2O_3$ nanowires was observed to occur in three basic steps, first dissolution of oxygenated Ga-species into molten gallium ($Ga_{(l)}$), followed by a phase segregation to create multiple nuclei on the surface, and finally by a homo-epitaxial growth of nuclei into 1-D structures from the bottom using the dissolved species. The $Ga_{(l)}$ pool served as a preferential sink for the absorption of gas-phase reactant and, when supersaturated, allowed bulk nucleation of 1-D structures. This method has produced a number of unique structures such as concentric tubules morphologies for 1-D structures in addition to nanowires.

Because catalytic properties of 1-D semiconductor oxide nanostructures, including $Ga_2O_3$, the experimental setup uses a plasma reactor (ASTEX 5010). It is imperative to limit the amount of reactive Ga to avoid formation and continued growth of larger $Ga_2O_3$ crystals in the mixed hydrogen/oxygen plasma (H/O-Pl).

The gallium oxide nanowebs were characterized for crystallinity, composition, and contamination using high-resolution transmission electron microscopy (HRTEM) and energy dispersive x-ray spectroscopy (EDX) respectively. Demonstration of this technique with gallium oxide certainly presents a new route for synthesis of nanostructures of other important metal oxides such as indium oxide, tin oxide, and zinc oxide.

In summary the present invention provides a method of synthesizing nanowire and/or nanotube networks from oxide nanostructures of several non-catalytic, low melting metals, comprising the steps of exposing molten non-catalytic low melting metals to an activated gas phase (for example, a microwave plasma) containing a mixture of oxygen and hydrogen radicals; and forming multiple nuclei that grow directly from the molten metal surface to form networks of crystalline low melting metal oxides comprised of one-dimensional nanostructures such as nanotubes and nanowires in an arrangement of wires forming crystalline networks defined as "nanowebs", "nanowire networks", and/or "two-dimensional nanowires" containing wire densities on the order of $10^9/cm^2$. The process involves creating droplets by either spraying metal or its oxide as a thin film or spraying a nano-metal oxide particle dispersion and then exposing the area containing the droplets using activated gas phase chemistry such as a plasma gun using hydrogen/oxygen mixtures.

It is an object of the present invention to utilize the direct synthesis approach involving low-melting metals providing a technique for working at lower temperatures than those required for traditional catalyst-assisted and physical evaporation methods.

It is another object of the present invention to synthesize one-dimensional nanostructures for metal oxides applying the direct synthesis approach of the instant invention, where one would not need the creation of gas phase growth species.

It is another object of the present invention to provide a method of control over the morphology of the one-dimensional nanostructures due to manipulability of the gas phase chemistry alone.

It is another object of the present intention to control the plasma uniformity over molten metal surfaces in order to tune the resulting one-dimensional morphology.

It is another object of the present invention to provide a method to create a regular two-dimensional/three-dimensional network of nanowires and nanotubules of metal-oxides.

It is another object of the present invention to provide a method of forming two-dimensional networks or regular, polygonal networks with $100/cm^2$ to $10^{10}/cm^2$.

It is another object of the present invention to provide a method of producing nanowire/nanotube (segments)—diameters between 1 nm-1000 nm, lengths from 10 nm-100 microns.

It is another object of the present invention to provide a method to produce three dimensional webs forming a network having a thickness of from in a range of from 20 nm-1000 nm.

It is another object of the present invention to provide a method for producing a network over an area creating a network formation ranging from 500 nm×500 nm to several square meters.

It is another object of the present invention to limit the amount of reactive Ga to avoid formation and continued growth of larger $Ga_2O_3$ crystals in the mixed hydrogen/oxygen plasma (H/O-Pl) in order to form nanowebs.

It is another object of the present invention to produce material with 3-dimensional symmetry have exhibited nanotubular morphology during direct synthesis without the help of templates.

It is another object of the present invention to produce material having a layered structure.

Other objects, features, and advantages of the invention will be apparent with the following detailed description taken in conjunction with the accompanying drawings showing a preferred embodiment of the invention.

BRIEF DESCRIPTION OF THE DRAWINGS

A better understanding of the present invention will be had upon reference to the following description in conjunction with the accompanying drawings in which like numerals refer to like parts throughout the several views and wherein.

DESCRIPTION OF THE PREFERRED EMBODIMENT

Figure 1:
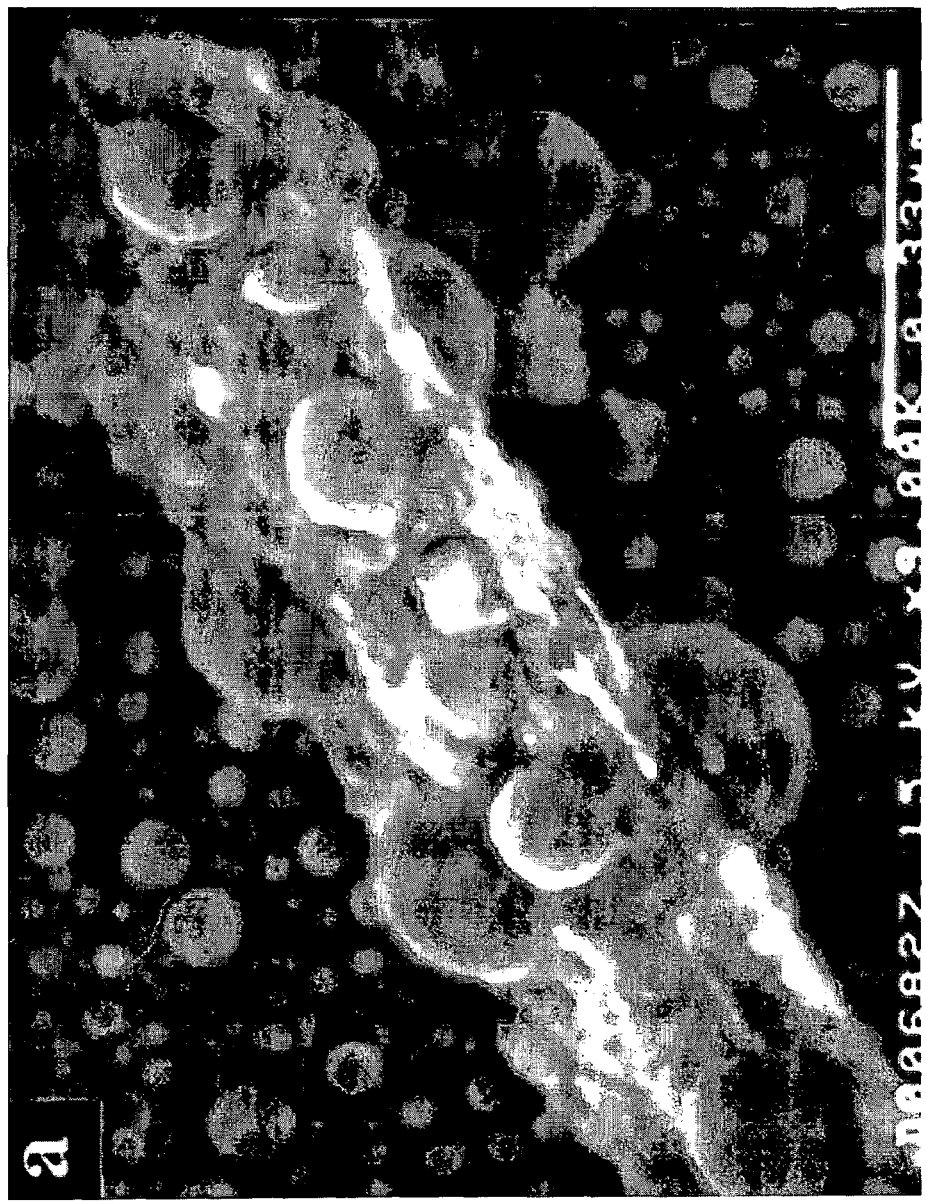
FIG. 1 is an image taken with a scanning election microscope of an image of a gallium droplet formation showing a precursor gallium oxide crystal after partial reaction in a hydrogen plasma, and where the residual $Ga_2O_3$ crystal is covered with Ga droplets while the background shows nm-sized Ga-droplet accumulation.

In this regard, this study allows a rapid self-assembly of gallium oxide ($Ga_2O_3$) nanowires into a network. These are not precise nano-structures, but unlike fractal networks, the $Ga_2O_3$ nanowires will be shown to intersect and form webs parallel to the substrate which it is believed is characteristic with the other low melting metal oxides described henceforth.

The present invention relates to a novel direct synthesis technique for low melting metal oxide nanowebs from a variety of low-melting metals. The technique involves exposing pool of a molten metal to an environment of oxygen and hydrogen radicals at elevated temperatures. Thermodynamic calculations show that molten metals such as Ga, In, Al, Sn, and Zn spontaneously oxidize at very moderate oxygen partial pressure. The present invention provides a method to control nucleation and growth of the metal oxide crust on the molten metal surface forming multiple nucleation and growth of noncatalytic low melting metal nanostructures directly therefrom creating highly crystalline metal oxide nanowires devoid of any structural defects having a range of from 20 to 100 nm thick and a range of up to a thousand microns long and more typically from 10 to several hundred microns long.

Multiple nucleation and growth of metal oxide nanostructures occurs directly out of a molten metal pool upon exposure to appropriate composition of hydrogen and oxygen in the gas phase. Oxygen from the vapor phase forms surface adsorbed species on the molten metal surface. These oxygenated metal species dissolve into the bulk melt followed by phase segregation to create multiple nuclei on the surface. In the absence of hydrogen in the plasma, these nuclei aggregate to form a polycrystalline crust on the molten metal surface. However hydrogen/oxygen chemistry enables nuclei segregation on the melt surface, preventing the complete crust formation. These nuclei grow in one dimension upon basal attachment of the bulk growth species. The dynamics of the pattern formation and the time of nuclei coalescence determine the morphology of the resulting structure. Thus, the gas phase chemistry allows manipulation of the nanostructure composition, structure, and morphology.

Synthesis was carried out in a microwave plasma reactor (ASTEX 5010) using $H_2CH_4O_2$ gas mixtures. Quartz, alumina, pyrolytic boron nitride, glassy carbon, polycrystalline diamond film, porous graphite, and sapphire substrates were covered with a thin film of molten gallium and were exposed to a microwave plasma containing a range of gas phase species. During the plasma exposure, molten gallium flowed on all the substrates forming a thin film, which followed by formation of a thin polycrystalline film along with sparse nanowires. Gallium droplets were intentionally put on these polycrystalline oxide covered substrates and further synthesis experiments were carried out. The nanowires and other one-dimensional structures were grown from these large gallium drops. The substrate temperature was measured using an infrared pyrometer to be approximately 550° C. for 700 W microwave power, 40 Torr total pressure, and 8.0 sccm $O_2$ in 100 sccm of hydrogen in the inlet stream. The experiments were performed at the following range of growth conditions: microwave power of 600-1200W, pressure of 30-60 Torr, growth duration of 1-12 hours, 0.6-10 sccm $O_2$ 0-2 sccm $CH_4$ in 100 sccm of hydrogen in the feed gas. The post-synthesis samples were imaged using a LEO 1430 scanning electron microscope (SEM). As-grown samples were analyzed for crystalline quality using a Rigaku powder X-ray diffractometer (X'D). Individual nanowires were analyzed for crystallinity and composition using high-resolution transmission electron microscopy (HRTEM) (200 kV JEOL 2010F) and Energy Dispersive X-ray spectroscopy (EDX). The samples for TEM analysis were prepared by scraping the nanowire mass from the substrate, dispersing in acetone and dropping on to a copper TEM grid.

The feasibility of this direct synthesis approach was demonstrated for $Ga/Ga_2O_3$. Also highly crystalline beta-gallium oxide tubes, nanowires, and unique one-dimensional structures have been synthesized using molten gallium and microwave plasma containing a mixture of monoatomic oxygen and hydrogen. Synthesis was carried out in a microwave plasma reactor (ASTEX 5010) using $H_2/CH_4/O_2$ gas mixtures. Quartz, alumina, pyrolytic boron nitride, glassy carbon, polycrystalline diamond film, porous graphite, and sapphire substrates were covered with a thin film of molten gallium and were exposed to a microwave plasma containing a range of gas phase species. The substrate temperature was measured using an infrared pyrometer to be approximately 550° C. for 700 W microwave power, 40 Torr total pressure, and 8.0 sccm O2 in 100 sccm of hydrogen in the inlet stream. The experiments were performed at the following range of growth conditions: microwave power of 600-1200W, pressure of 30-60 Torr, growth duration of 1-12 hours, 0.6-10 sccm $O_2$ 0-2 sccm $CH_4$ in 100 sccm of hydrogen in the feed gas.

Synthesis was also carried out in a microwave plasma reactor (ASTEX 5010) using $H_2/CH_4/O_2$ gas mixtures. Quartz, alumina, pyrolytic boron nitride, glassy carbon, polycrystalline diamond film, porous graphite, and sapphire substrates were covered with a thin film of molten gallium and were exposed to a microwave plasma containing a range of gas phase species. During the plasma exposure, molten gallium flowed on all the substrates forming a thin film, which followed by formation of a thin polycrystalline film along with sparse nanowires. Gallium droplets were intentionally put on these polycrystalline oxide covered substrates and further synthesis experiments were carried out. The nanowires and other one-dimensional structures discussed in this paper were grown from these large gallium drops. The substrate temperature was measured using an infrared pyrometer to be approximately 550° C. for 700 W microwave power, 40 Torr total pressure, and 8.0 sccm $O_2$ in 100 sccm of hydrogen in the inlet stream. The experiments were performed at the following range of growth conditions: microwave power of 600-1200W, pressure of 30-60 Torr, growth duration of 1-12 hours, 0.6-10 sccm $O_2$ 0-2 sccm $CH_4$ in 100 sccm of hydrogen in the feed gas. The post-synthesis samples were imaged using a LEO 1430 scanning electron microscope (SEM). As-grown samples were analyzed for crystalline quality using a Rigaku powder X-ray diffractometer (X'D). Individual nanowires were analyzed for crystallinity and composition using high-resolution transmission electron microscopy (HRTEM) (200 kV JEOL 2010F) and Energy Dispersive X-ray spectroscopy (EDX). The samples for TEM analysis were prepared by scraping the nanowire mass from the substrate, dispersing in acetone and dropping on to a copper TEM grid.

Based on the average values of surface energies for gallium oxide (1.105 $J/m^2$ determined from heat of sublimation data and molten gallium (0.718 $J/m^2$, the contact angle is estimated as 180° using the equation of state and Young's equation. Poor wet-ability of gallium oxide with molten gallium was further confirmed by two different experimental observations. Molten gallium film spread on polycrystalline gallium oxide film was converted into droplets when exposed to microwave plasma containing oxygen and hydrogen radicals for less than ten minutes. The second experimental observation was the convex meniscus indicating obtuse contact angle between the gallium oxide rod and the molten gallium at the interface. It is contemplated that other molten metals such as In, Al, Sn, and Zn would also form a convex meniscus with their oxides due to high surface energies. The X'D (spectrum not shown) confirmed the synthesized sample to be monoclinic gallium oxide phase ($a_0$=12.23 Å, $b_0$=3.04 Å, $c_0$=5.8 Å, $\beta$=103.7°, C2/m).

Formation of Nanowebs

The concept of multiple nanowire nucleation and growth has been demonstrated beyond the elemental nanowires, with bulk synthesis of gallium oxide nanowires from large pools of molten gallium exposed to an activated gas phase containing oxygen precursors. The nucleation and growth of $Ga_2O_3$ nanowires was observed to occur in three basic steps, first dissolution of oxygenated Ga-species into molten gallium ($Ga_{(l)}$), followed by a phase segregation to create multiple nuclei on the surface, and finally by a homo-epitaxial growth of nuclei into one dimensional structures from the bottom using the dissolved species. The $Ga_{(l)}$ pool served as a preferential sink for the absorption of gas-phase reactant and, when supersaturated, allowed bulk nucleation of one dimensional structures. This method has produced a number of unique structures such as concentric tubules and paintbrush-like morphologies for one dimensional structures in addition to nanowires.

The following examples describe a preferred embodiment of the invention for producing nanowebs. Other embodiments within the scope of the claims herein will be apparent to one skilled in the art from consideration of the specification or practice of the invention as disclosed herein. It is intended that the specification, together with the examples, be considered exemplary only, with the scope and spirit of the invention being indicated by the claims which follow the examples. In the examples all percentages are given on a weight basis unless otherwise indicated.

The instant invention is modeled after the previous system using the same plasma reactor (ASTEX 5010). Commercially available gallium oxide powder (Alfa Aesar) was dispersed in acetone and ultrasonicated for 2 minutes. Five drops of the well-dispersed suspension were then dropped on a 1 cm×1 cm quartz substrate and allowed to dry naturally. The resulting deposit on the substrate constituted a dense packed agglomerate of polycrystalline gallium oxide particles. (SEM showed precursor particles ranged from 50-300 microns). The gallium oxide film was then exposed to hydrogen plasma followed by hydrogen-oxygen plasma. The plasma treatments were done in a microwave plasma reactor (ASTEX 5010) at the following range of process conditions: Microwave power of 500-1200 W, pressure of 20-60 Torr, 2-30 minutes of hydrogen plasma treatment, 15 minutes to 3 hours of plasma treatment to a mixture of hydrogen and oxygen (0.6 20 sccm $O_2$/100 sccm in the feed gas). The substrate temperature was measured using an infrared pyrometer to be approximately 550° C. for 700 W microwave power, 40 Torr total pressure, and 10.0 sccm $O_2$ in 100 sccm of hydrogen in the inlet stream. The x-ray diffraction patterns (X'D) were obtained using a Pillips diffractometer. The micro and nanostructures of the as-synthesized nanoweb samples were imaged using a JEOL JSM6300 field emission scanning electron microscope (FE-SEM), Hitachi S-2700 (SEM) with energy dispersive X-ray (EDX), and a Hitachi-HF-2000 transmission electron microscope (HRTEM) with energy x-ray spectrometer (EDS).

Figure 2:
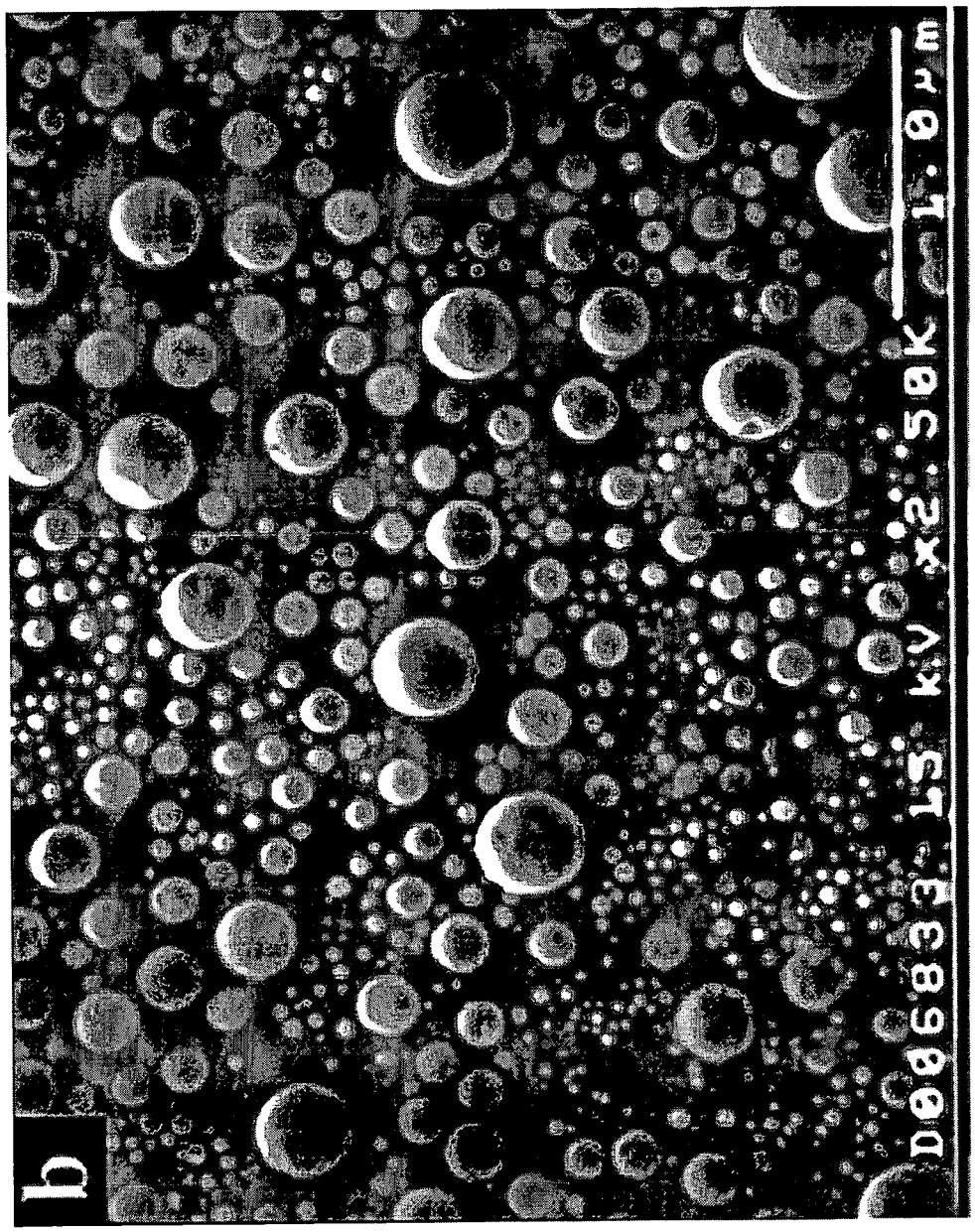
FIG. 2 is an image taken with a scanning election microscope of the image of gallium droplet formation showing a thin film of gallium metal droplets with predominantly nm-size range.
Figure 3:
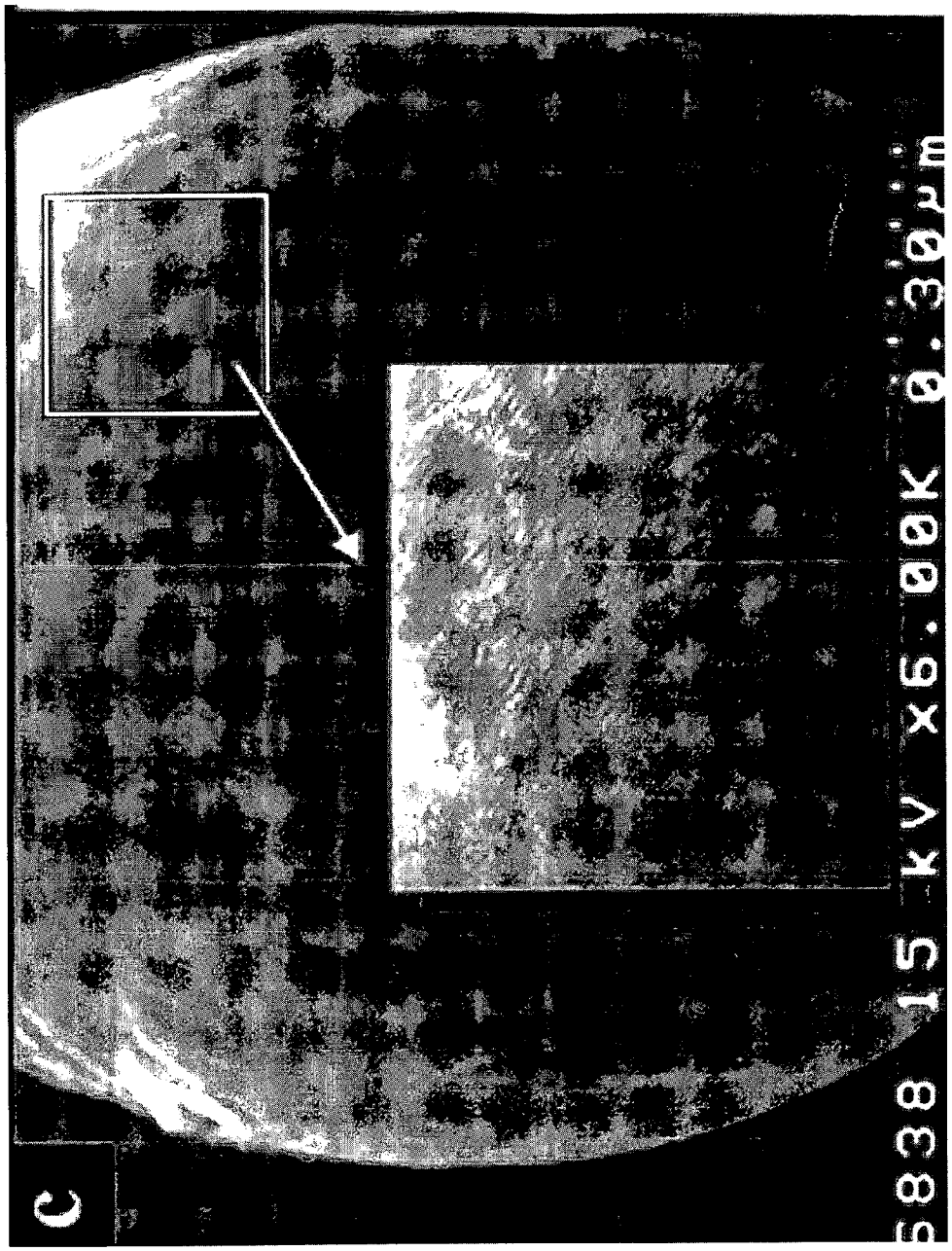
FIG. 3 is an image taken with a scanning election microscope of an images of a gallium droplet formation showing a large diameter Ga-droplet reveals oxide crust formation and whereby the insert shows a fractal-like structure.
Figure 4:
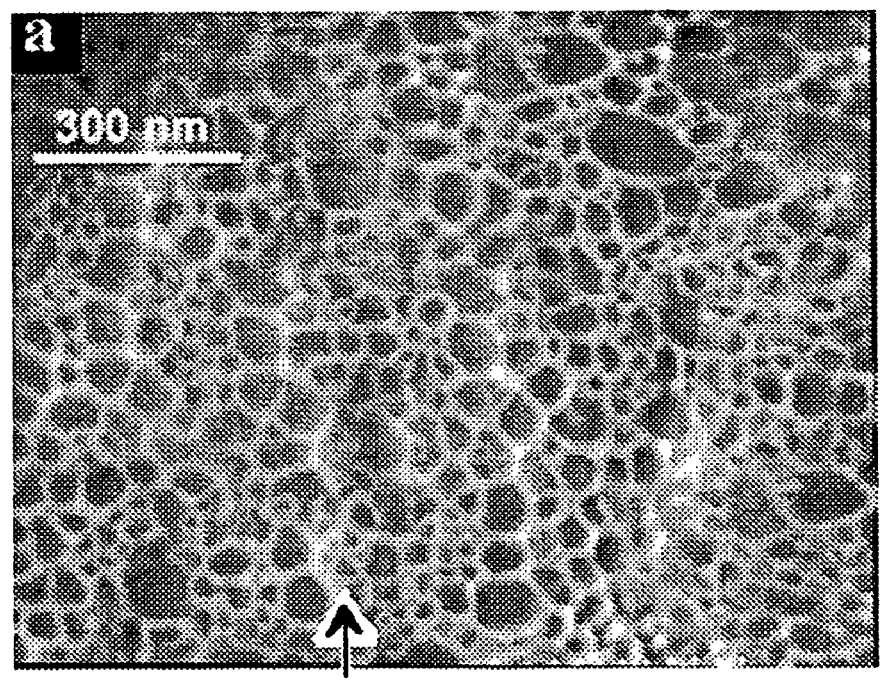
FIG. 4 is an image taken with a scanning election microscope of images of a gallium oxide nanoweb and network structure showing a lattice-type nanoweb at high magnification with preferential growth of nanowires parallel to the substrate surface. 1-D nanowires ($\beta$-$Ga_2O_3$) intersect and form regular polygonal networks when Ga-droplet precursors are nm-sized and evenly spread over surface.
Figure 5:
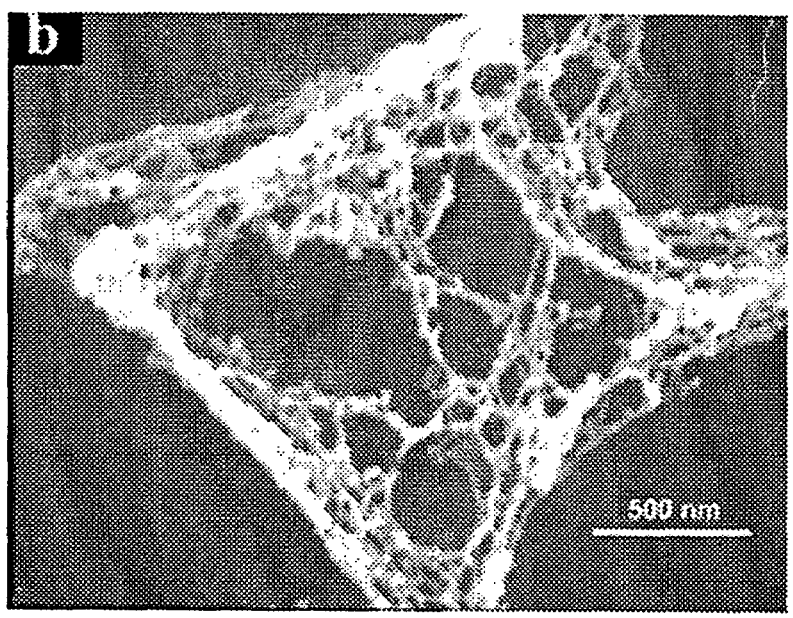
FIG. 5 is an image taken with a scanning election microscope of images of a gallium oxide nanoweb and network structure showing an image of a sample with less ideal web formation, because larger gallium pool was used than in (a) to serve as precursor, which lead to localized build-up of wires.
Figure 6:
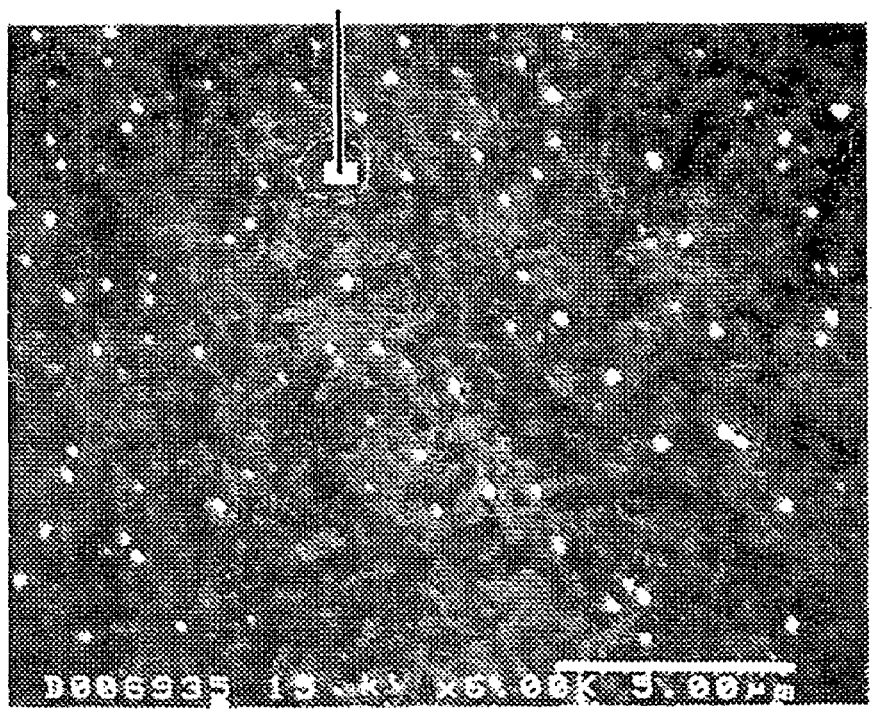
FIG. 6 is an image taken with a scanning election microscope of images of a gallium oxide nanoweb and network structure showing nanowebs at lower magnification showing extended area over several microns, whereby the localized white spots are residual Ga-droplets.
Figure 7:
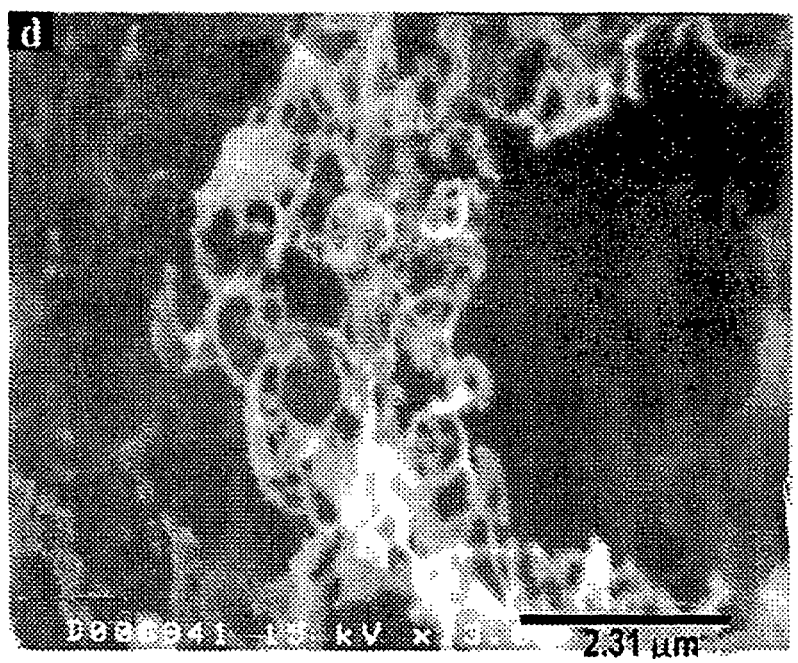
FIG. 7 is an image taken with a scanning election microscope of images of a gallium oxide nanoweb and network structure showing a lower magnification of same sample as shown at high magnification in FIG. 5 and whereby larger Ga precursors lead to the build-up of coarser, micron-sized web structures.
Figure 8:
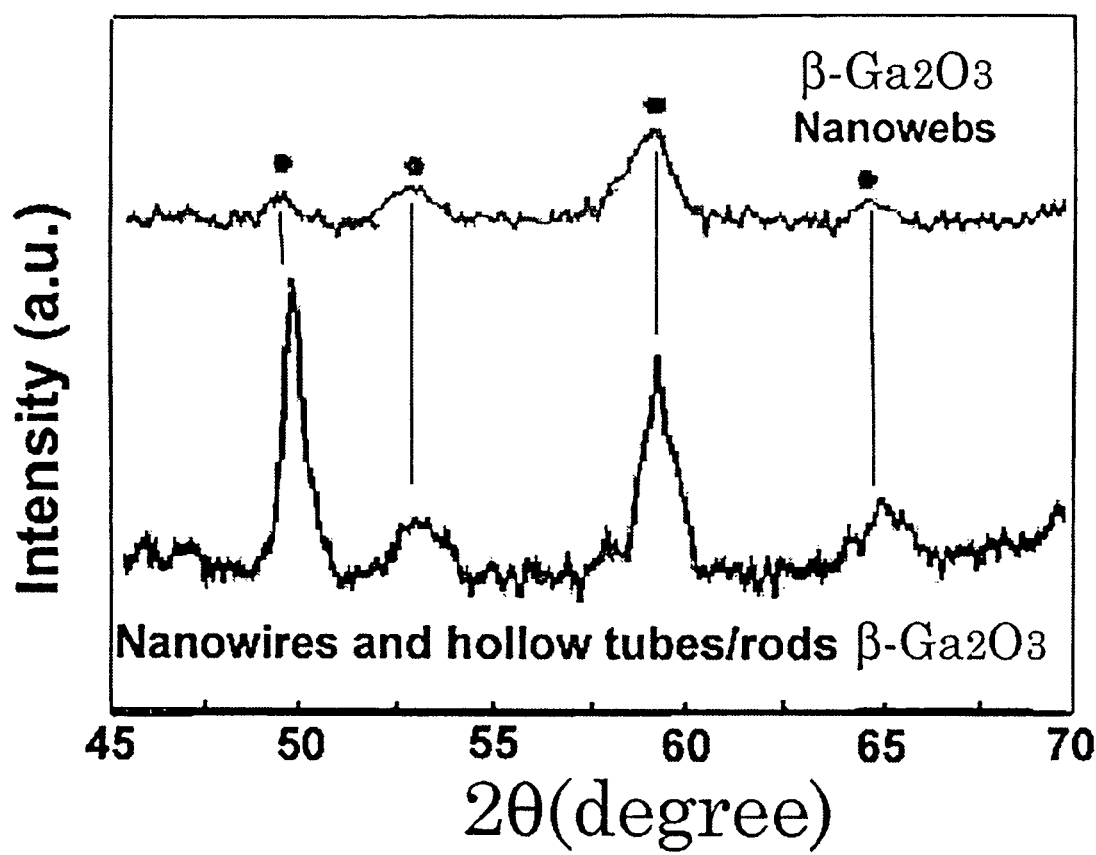
FIG. 8 shows the XRD spectra of nanowebs with peak-broadening effects formed in the current study in comparison with nanowires and hollow tubes formed in previous experiments.

Given that $Ga_2O_3$ can be reduced to Ga metal ($Ga_{(l)}$) by treatment with hydrogen radicals, a limited amount of commercially available $Ga_2O_3$ precursor polycrystalline powder (99.999% pure powder from Alfa Aesar) was exposed to a hydrogen plasma (H-Pl: 2 minutes to 1 hour exposure time). Field emission scanning electron microscopy (FE-SEM) images illustrate that during the time-controlled experiments the precursor $Ga_2O_3$ particles are reduced and form limited amounts of $Ga_{(l)}$ as shown in FIG. 1. A thin film of nm-sized $Ga_{(l)}$ droplets was observed on the quartz surface in approximate vicinity to eroding $Ga_2O_3$ grains. Longer exposure to the H-Pl consumed all precursor grains, resulting in a homogeneous thin film of nm-sized $Ga_{(l)}$ droplets on the quartz substrate as illustrated in FIG. 2. The liquid-metal surface oxidation is of particular importance. This is because these surfaces are highly reactive, which has been recently investigated using surface X-ray techniques and supported by secondary ion-mass spectrometry (SIMS) measurements on liquid-gallium surfaces where oxides form spontaneously with a fractal-like structure. The nucleation of $Ga_2O_3$ on a smooth liquid surface occurs differently than on crystal surfaces, where oxides nucleate at step edges or other defects. The oxide layer forms as an amorphous film on the disordered $Ga_{(l)}$ surface shown in FIG. 3 due to the presence of $H_2O$ in the gas phase. Although the thickness, structure and interfacial roughness of the oxide overlayer has not been identified, it is believed that the oxide overlayer on the $Ga_{(l)}$ droplets prevented extensive Ostwald ripening as best illustrated in FIG. 3. As a result, most droplets remain in the nm-size range. This is a significant observation because $Ga_{(l)}$ droplets tend to agglomerate due to high surface tension. One should note that pattern of gallium droplets could be produced using a variety of techniques such as evaporation etc. The substrates with patterns of gallium droplets were exposed to the H/O-Pl (15 minutes to 1 hour of plasma treatment to a mixture of 0.6-20 sccm $O_2$/100 sccm $H_2$ in the feed gas). It is believed that the individual nanowires grow vertically outward from the $Ga_{(l)}$ droplets, but contrary to expectation, nm-sized $Ga_{(l)}$ droplets self-assembled into an extensive two dimensional network of quasi-coupled nm-sized $Ga_2O_3$ nanowires. The wires formed parallel to the substrate surface as shown in FIGS. 4-6. The EDX spectra confirmed that the web-architecture consists of nanowires of Ga ($K\dot{O}$ at 9.3 keV, $L_{\dot{O}}$ at 1.1 eV) and O ($K_{\dot{O}}$ at 0.53 keV). A simple plasma technique leads to the self-assembly of web-like nanostructures. Individual wires are up to 0.5 microns in length with diameters of the order of 5-150 nm. Certain web arrangements contain interlinked $Ga_2O_3$ nanowires that resemble an open mesh or "fishnet" lattice as shown in FIG. 4 and are referred to as nanowebs. Experiments which have more gallium available for reaction and longer run times, result in compilations of numerous, discrete $Ga_2O_3$ networks shown in FIG. 5, which ultimately can extend over an area of tens of microns (FIGS. 6 and 7). Experiments with greater gallium pools and longer run times led to build-up of larger wires within networks as shown in FIG. 7. The X'D spectra confirm that the web structures in FIG. 8 consist of monoclinic β-$Ga_2O_3$ phase ($a_0$=12.23 A, $b_0$=3.04 A, $c_0$=5.8 A, β=103.7°, C2/m, JCPDS Card Number: 43-1012). Although the one dimensional structures previously grown from large gallium pools have characteristic sharp XRD-peaks corresponding to β-$Ga_2O_3$, nanowebs, in comparison, are β-$Ga_2O_3$ characterized by peak-broadening effects. The results indicate that this study synthesized nm-sized structures and even the larger surface covering $Ga_2O_3$ networks shown in FIG. 6 are composed of β-$Ga_2O_3$ nanowires.

Figure 9:
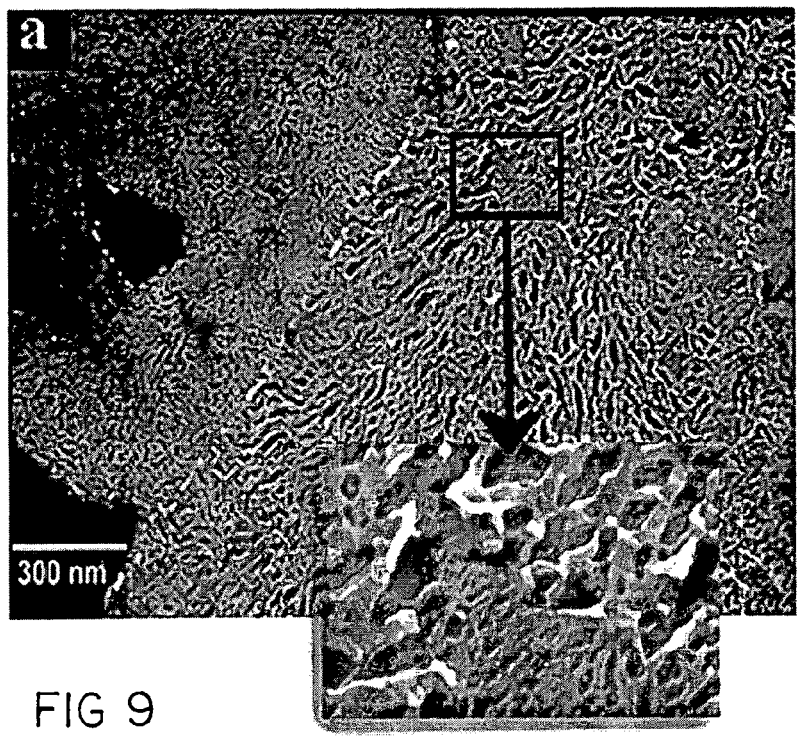
FIG. 9 is an image taken with a scanning election microscope of images of gallium oxide illustrating a layer-by-layer growth of nanowebs on a substrate surface that grew in a layered fashion.
Figure 10:
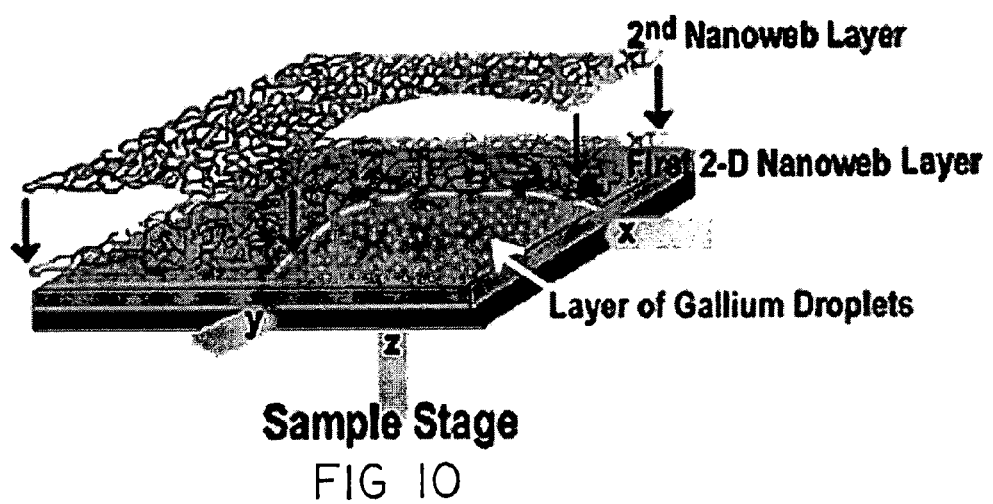
FIG. 10 is an image taken with a scanning election microscope of images of gallium oxide illustrating a layer-by-layer growth of nanowebs showing a schematic of layer-by-layer growth.

The quartz substrate, after forming the β-$Ga_2O_3$ nanowebs, did not appear cloudy. Preliminary data using UV-vis spectrometry confirms the retention of high degree of transparency. Results should be even better for inherently transparent semiconductor oxides such as those based on tin and zinc. Thorough characterization using UV photoelectron spectroscopy and UV-Vis spectrometry for electronic band-gap estimation is currently in progress. Nanowebs that formed in the presence of abundant precursor gallium are observed to form a layer-by-layer growth, which can be seen in the SEM image in FIG. 9. The stacking of multiple networks is illustrated in FIG. 10. The initial layer appears to be the precursor thin film of $Ga_{(l)}$ nanodroplets. Interaction with the H/O-Pl leads to the first $Ga_2O_3$ nanoweb layer as shown in FIGS. 4 and 10, which later can be blanketed by a second layer as shown in FIGS. 9 and 10, superimposed by a third layer, and so forth.

Nanowebs were observed over a large area of the substrates. There seem to be no other spatial limitations for nanoweb formation than those dictated by the plasma reactor dimensions. Although amorphous metal oxide networks with wire densities of up to $10^{10}/cm^2$ have been produced previously, they formed through selective chemical etching of thin films (prepared through template-based and sol-gel techniques). All prior techniques of forming nanowebs formed porous, amorphous metal oxides with network structures. In contrast, the nanowebs formed via the instant invention exhibit two dimensional self-assembly of crystalline oxide nanowires with wire densities of up to $10^9/cm^2$.

Figure 11:
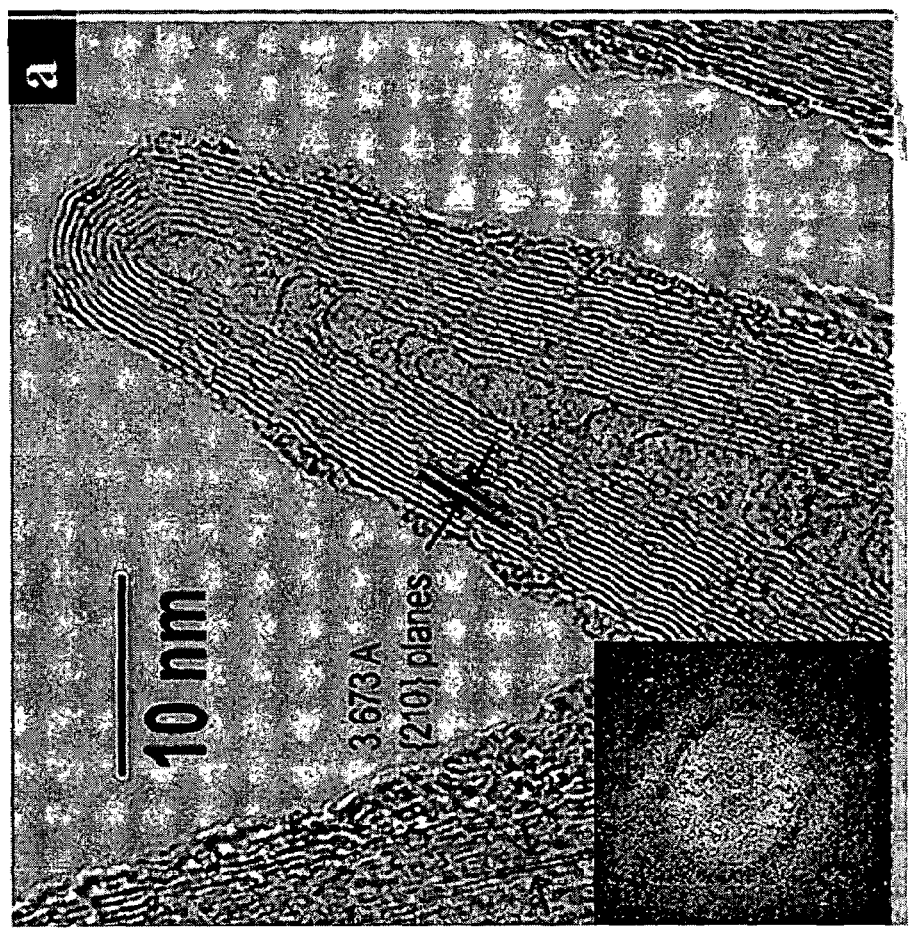
FIG. 11 is an image taken with a high resolution scanning election microscope (HRTEM) of individual gallium oxide nanostructures showing nanotubules with a central core and multiple outer layers wherein the d-spacing corresponds to 210 planes.
Figure 12:
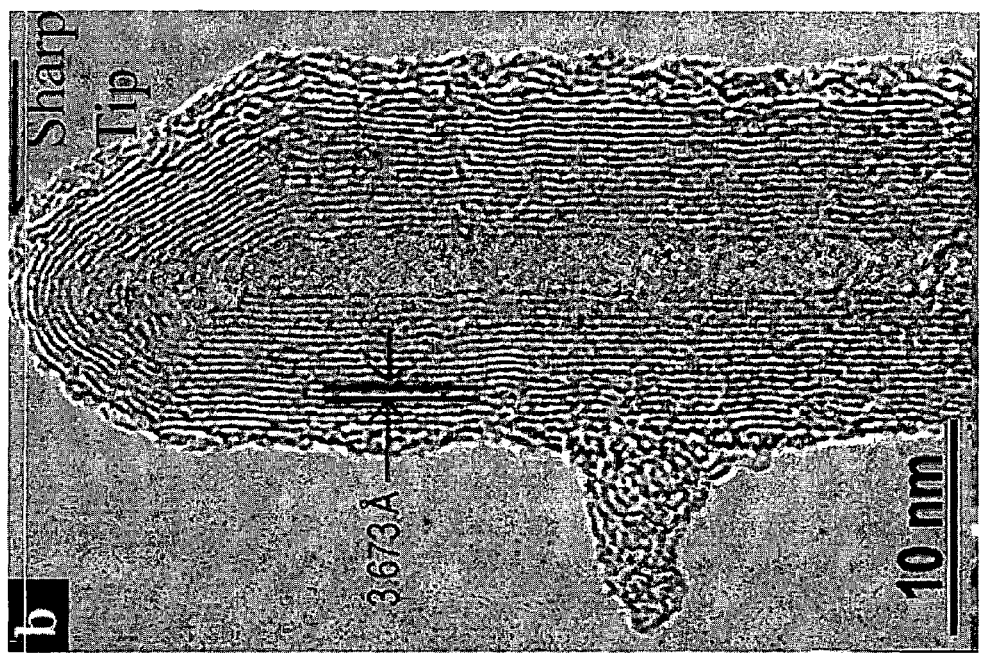
FIG. 12 is an image taken with a high resolution scanning election microscope (HRTEM)/of individual gallium oxide nanostructures of FIG. 11 showing that nanotubules can have a sharp tip.
Figure 13:
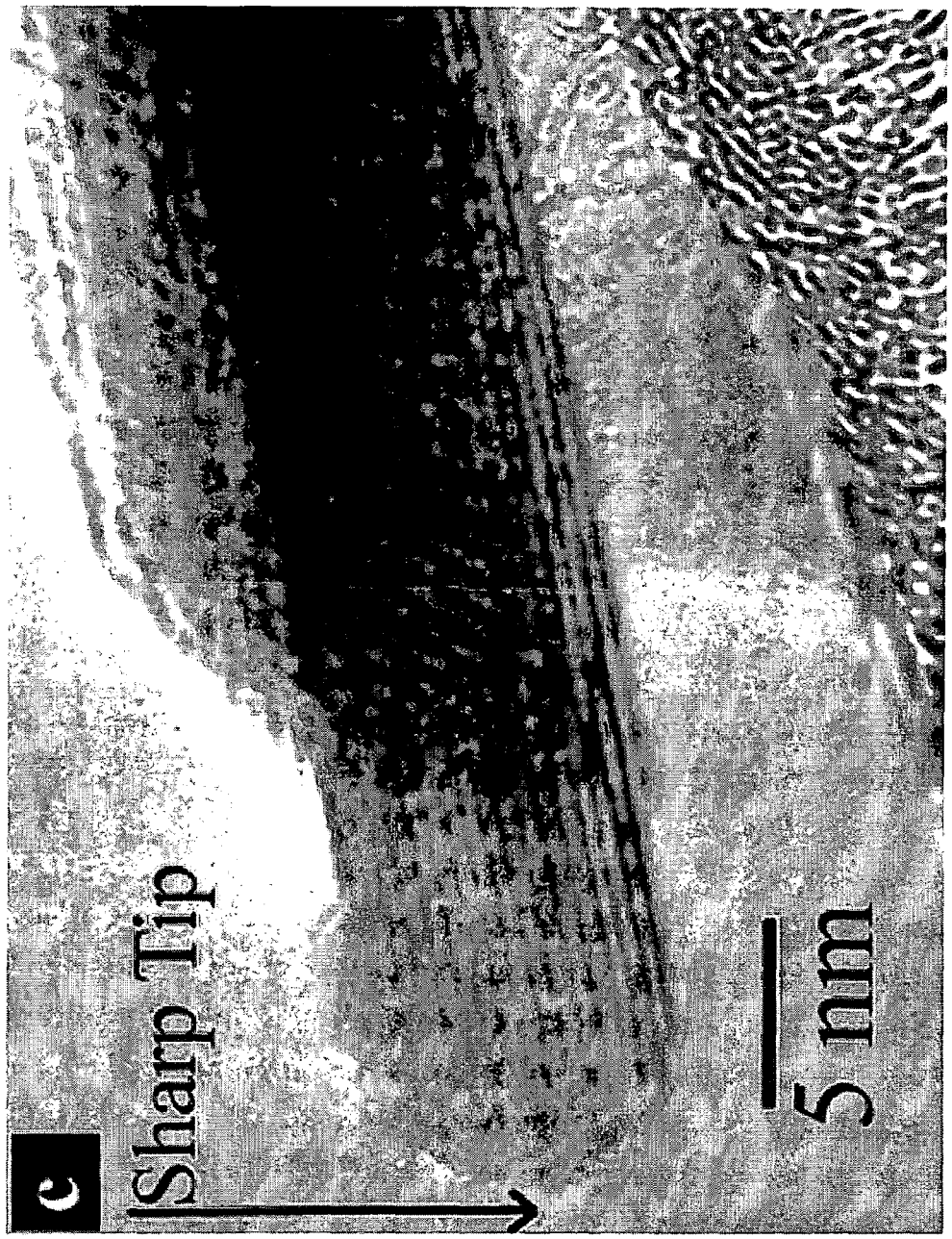
FIG. 13 is an image taken with a high resolution scanning election microscope (HRTEM) of individual gallium oxide nanostructures shows a nanotubule at the bottom of the image and two single crystal nanowires situated above it with a very sharp tip in the cap.
Figure 14:
FIG. 14 is an image taken with a scanning election microscope (TEM) of individual gallium oxide nanostructures showing lower magnification TEM image of a nanoweb wherein the insert demonstrates a polycrystallinity associated with the web structure.
Figure 15:
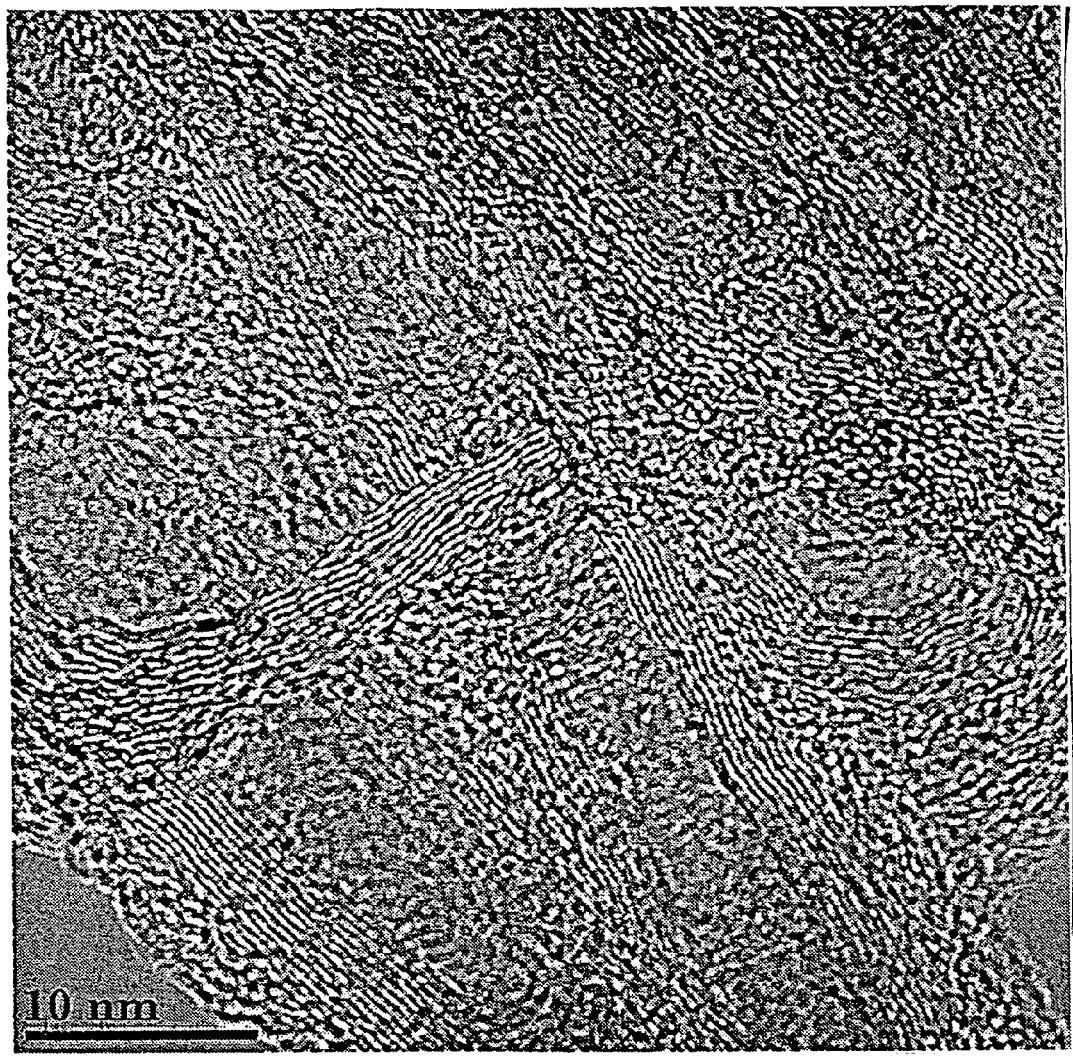
FIG. 15 is an image taken with a high resolution scanning election microscope (HRTEM) of individual gallium oxide nanostructures showing necking and crosslinking of $\beta$-$Ga_2O_3$ nanowires/tubes within a dense network structure.

The SEM investigation helped uncover how one end of individual $Ga_2O_3$ nanowires (within a nanoweb) has a slightly broader profile, while the opposite end appears spiky as illustrated in FIG. 4. It was presumed that the components of nanowebs would differ from the single crystalline $\beta$-$Ga_2O_3$ one dimensional structures that formed in the presence of large gallium pools in previous studies. High-resolution transmission electron microscopy (HRTEM) revealed that the nanoweb's discrete wires can have a tube-like appearance as shown in FIGS. 11 and 12. The individual one dimensional components (up to 0.5 microns in length and outer diameters ranging from 5-15 nm with inner diameters varying from 2.5 to 5 nm) are composed of a cored interior that is engulfed by multiple exterior layers, and bent layers at the tip as illustrated in FIGS. 11 and 12. Furthermore, the individual $Ga_2O_3$ nanotubules are single crystalline. The insert in FIG. 11 shows the selected area corresponding electron diffraction pattern indicating the polycrystalline nature of the entire network as expected. The HRTEM results further confirm the monoclinic nature of the $Ga_2O_3$ nanotubes. The lattice spacing in HRTEM images matched that for monoclinic $\beta$-$Ga_2O_3$ as shown in FIGS. 11 and 12. The d-spacing corresponds to the $\beta$-$Ga_2O_3$ (201) planes with 3.673 Å. FIG. 13 illustrates extremely small (7 nm wide) single crystal nanowires instead of tubes, which formed when nanowebs were re-submitted to hydrogen plasma for 5 minutes and then followed by mixed plasma for 10 minutes. A larger re-crystallized web area is depicted in FIG. 14 while FIG. 15 demonstrates how individual nanowires/tubes are cross-linked within the nanoweb and shows necking of some wires/tubes. It has been known that orientation at the nanoscale involves spontaneous self-organization of adjacent particles (in this case wires), which may be followed by joining of these particles (wires) at a planar interface. Bonding of wires may reduce overall surface energy by removing surface energy associated with unsatisfied bonds. Typically such a mechanism is only associated with systems where particles are free to move (i.e., in solution), but the present experiments represent a mobile enough system with continuous oxidation-reduction reactions. The HRTEM images also revealed that the top area of the $Ga_2O_3$ nanotubules exhibited a sharp tip in the cap as shown in FIGS. 11 and 12.

Nanotubular structures have been produced primarily for layered structured materials, and there seems to be no limit on the kind of compound that can serve as a precursor for the formation of nanotubular structures. Fewer materials with 3-dimensional symmetry have exhibited nanotubular morphology during direct synthesis without the help of templates. The present results with gallium oxide nanotubes are significant in that regard because gallium oxide does not exhibit a layered structure. Prior results with tubular morphologies for non-layered inorganic systems were obtained using a sol-gel process or applying a template structure.

It is believed that the nucleation and growth of nanowebs which are composed of wires/tubes of $\beta$-gallium oxide occurs in six consecutive steps:

(1) reduction of limited amount of polycrystalline $Ga_2O_3$ particles with reactive hydrogen;
(2) formation of thin film with nm-sized $Ga_{(1)}$ droplets;
(3) decrease of surface tension of $Ga_{(1)}$ droplets in the mixed plasma, allowing the metal to wet the substrate surface whereby forming flattened Ga discs;
(4) re-oxidation of $Ga_{(1)}$ in the presence of reactive H/O-Pl and preferential growth of nanowires from Ga discs parallel to the substrate
(5) molecular assembly into nanotubular structures;
(6) spatial guidance of nanowires to grow toward each other.

Figure 16:
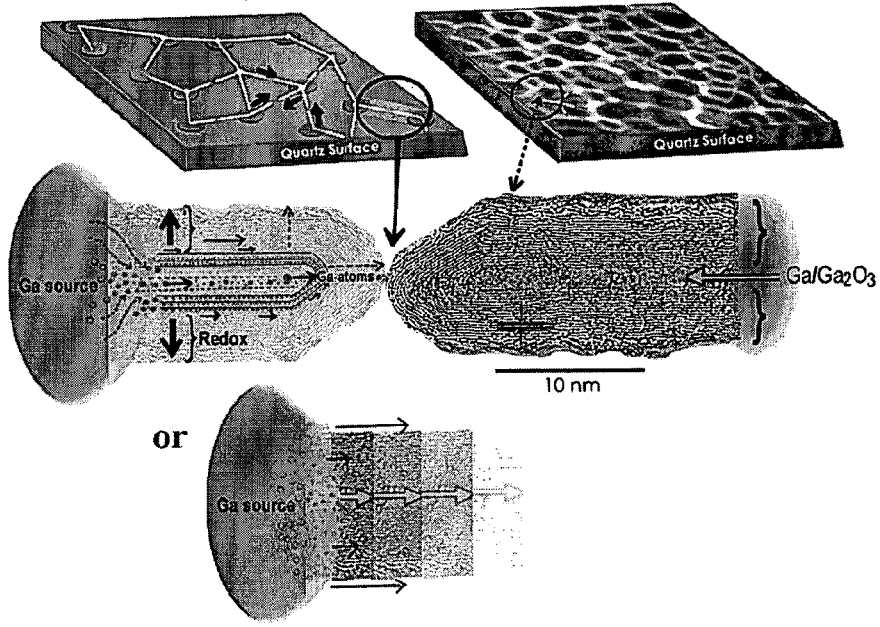
FIG. 16 illustrates the six consecutive mechanistic steps involved in nanoweb formation.

The individual steps are illustrated in FIG. 16.

In Step (1) the key factor for nanoweb formation is to start with only nm-sized $Ga_{(1)}$ droplet precursors to limit the amount of Ga available for reaction. Uncontrolled amounts of Ga would cause multiple nanowires to grow radially outward form the Ga pool and react later in the H/O-Pl, causing continuous formation of micron-sized $Ga_2O_3$ tubes and rods. The reduction of polycrystalline $Ga_2O_3$ with reactive hydrogen sets the stage for Step (2) where a thin oxide crust on the nm-sized $Ga_{(1)}$ droplets prevents extensive Ostwald ripening, inhibiting the formation of larger Ga-pools as shown in FIG. 3. The crusts form upon reactions of OH*, $H_2O_{(g)}$ molecules (made available during the reduction of $Ga_2O_3$) and/or $O_2$ with $Ga_{(1)}$-droplet exteriors. Step (3) initiates the two dimensional self-assembly process. It begins by lowering the surface tension of $Ga_{(1)}$ droplets. The continued oxidation-reduction process serves the same purpose as if the metal were to wet the substrate surface forming Ga discs (flattening the droplets). The multiple nucleation and growth of nanowires in the presence of reactive H/O-Pl in Step (4) from flattened disc surface ensures that the wires grow parallel to the substrate. The nanowires could grow until either the Ga source from the discs is exhausted, or they impinge onto another nanowire. Fundamentally, the most important role of the nanoscale oxidation-reduction process is the formation of tubular structures of $\beta$-$Ga_2O_3$, which has not been described, in prior reports. Step (5) in our mechanism focuses on the formation of multi wall $Ga_2O_3$ nanotubules, which occurs without a template. In FIG. 16 two possible ways are schematically drawn to show how the nanotubules form: either, by growing outward and width-wise, or only by outward growth. In either case, the mechanism in Step (5) has to account for a certain annihilation of the peripheral dangling bonds, which controls the growth of the outer walls and also what is the driving force to form capped nanotubules. The tube walls form when the surface diffusion rate of Ga-atoms (from the $Ga_{(1)}$ droplet) controls their repositioning along the side of the initial wire. The Ga atoms are oxidized in the process. The tube walls grow until the nm-sized Ga-pool is depleted. This nanoscale oxidation-reduction process for the formation of nanotubules is set forth as follows: Gallium metal atoms migrate to concentrate at the tip of the tubules. The presence of water and/or oxygen then serves to fix a number of these atoms as $Ga_2O_3$ nuclei in the tube walls and migration of additional Ga-atoms makes this a continuous growth process. The process requires sufficient thermal energy in order to overcome the activation barrier associated with the bending of the layers (elastic strain energy), see HRTEM images (FIGS. 11 and 12). Several nanotubules or wires can originate and grow from few tens of nm-sized Ga-disc, indicating multiple nucleation events. The wires intersect, allowing for a self-assembly of wires into a two dimensional web. The role of the limited $Ga_{(1)}$ source is to supply Ga atoms only to a selected few wires. It is suggested that the 6-20 nm wide nanotubules formed from nm-sized Ga droplets, and the thicker (150 nm) wires nucleated from larger Ga droplets.

A number of factors will contribute to help control the length and thickness of individual wires that are part of a nanoweb:
(1) The ratio of reductant to oxidant in the gas phase (plasma).
(2) The concentration of reactive hydrogen atoms produced in the plasma.
(3) The temperature of the vessel (controlling the surface diffusion rate of Ga-atoms and size of resulting nanowires).
(4) The size distribution and density of created gallium droplets.

Nanotubular growth represents an equilibrium situation where a continuous oxidation-reduction process proceeds on the molecular level. The energy gap of an individual nanowire/tube increases with decreasing size and therefore, any control on tube/wire size is advantageous for nano device applications. Carefully controlling the $Ga_{(1)}$ droplet size (<50 nm) helps synthesize uniform nanowebs composed of only nanotubules. The distance between $Ga_{(1)}$ droplets (and droplet size) appears to control the length of the growing wires Step (6) controls the spatial arrangement and connectivity of individual wires. It appears there is a driving force to cause the growing wires to intersect and to join as a single wire at nanometer scale. Alignment occurs remote from their origin, i.e., $Ga_{(1)}$ nanodroplet. It appears that the self-assembly may be similar to that observed in solid state chemistry of oxides in which nanoscale oxide crystals rotate to join perfectly. Whether it is an appearance or special phenomena needs to be further verified. However, the electronic make-up of the wires/tubes (or surface chemistry) may play an important role.

The formational mechanism and evolution of $Ga_2O_3$ nanowebs (multiple nucleation and coalescence) suggests that this process could be extended to formation of two- or three-dimensional nanowire networks of other low melting metal oxides such as $SnO_2$, ZnO and $In_2O_3$ etc.

Factors important in the self-assembly process are: (a) determining the degree of structural order (b), observing nanoscale patterns, ©) measuring feature size distribution, (d) determining the degree of short (nm) and long (mm) range order and (e) optical, electrical and catalytic properties.

The large surface to volume ratios and crystalline nature of the individual web components provide novel applications for catalysis and sensing distinctive from zero-dimensional nanoparticles, two-dimensional films and wire-like or belt-like metal oxides.

The following examples describe preferred embodiments of the invention. Other embodiments within the scope of the claims herein will be apparent to one skilled in the art from consideration of the specification or practice of the invention as disclosed herein. It is intended that the specification, together with the examples, be considered exemplary only, with the scope and spirit of the invention being indicated by the claims which follow the examples.

EXAMPLE 1

Commercially available gallium oxide powder (Alfa Aesar) was dispersed in acetone and ultrasonicated for 2 minutes. Five drops of the well-dispersed suspension were then dropped on a 1 cm×1 cm quartz substrate and allowed to dry naturally. The resulting deposit on the substrate constituted a dense packed agglomerate of polycrystalline gallium oxide particles. (SEM showed precursor particles ranged from 50-300 microns). The gallium oxide film was then exposed to hydrogen plasma followed by hydrogen-oxygen plasma. The plasma treatments were done in a microwave plasma reactor (ASTEX 5010) at the following range of process conditions: Microwave power of 500-1200 W, pressure of 20-60 Torr, 2-30 minutes of hydrogen plasma treatment, 15 minutes to 3 hours of plasma treatment to a mixture of hydrogen and oxygen (0.6 20 sccm $O_2$/100 sccm in the feed gas). The substrate temperature was measured using an infrared pyrometer to be approximately 550° C. for 700 W microwave power, 40 Torr total pressure, and 10.0 sccm $O_2$ in 100 sccm of hydrogen in the inlet stream. The x-ray diffraction patterns (X'D) were obtained using a Pillips diffractometer. The micro and nanostructures of the as-synthesized nanoweb samples were imaged using a JEOL JSM6300 field emission scanning electron microscope (FE-SEM), Hitachi S-2700 (SEM) with energy dispersive X-ray (EDX), and a Hitachi-HF-2000 transmission electron microscope (HRTEM) with energy x-ray spectrometer (EDS).

EXAMPLE 2

Two-Dimensional Nanostructures: Nanowire Networks (Nanowebs)

Figure 17:
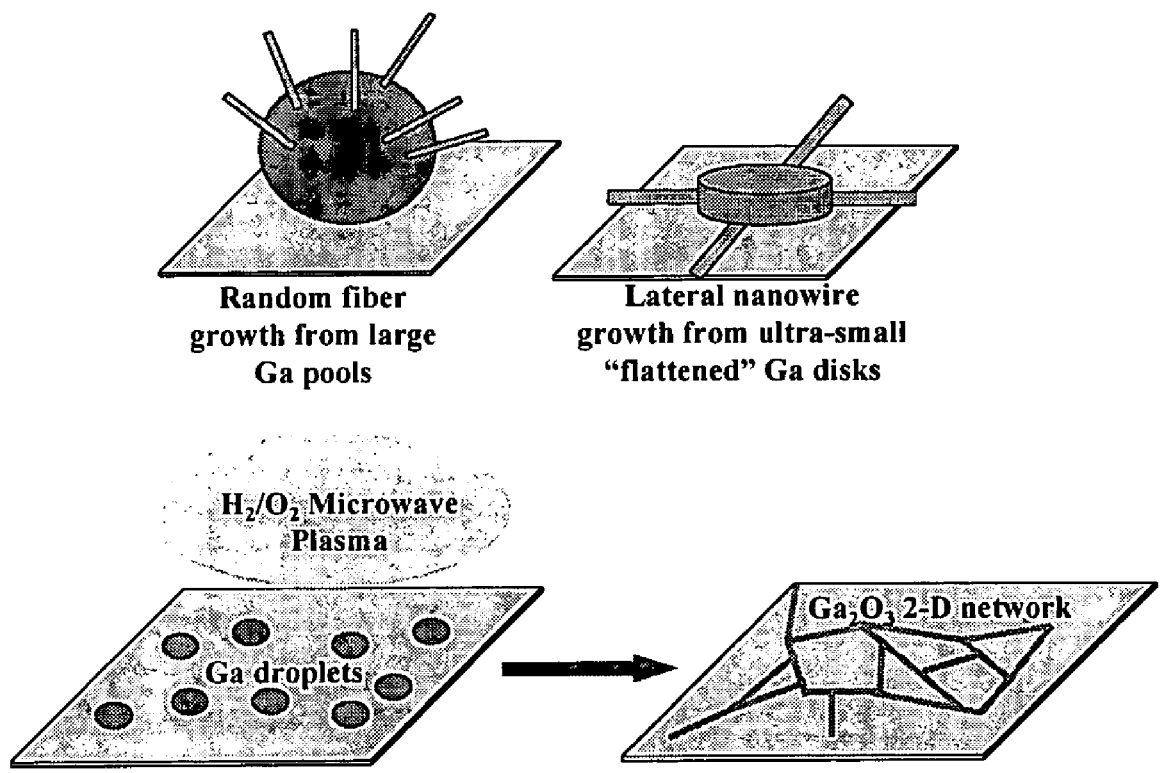
FIG. 17 is a schematic illustrating the mechanism for two dimensional nanowire network formation.
Figure 18:
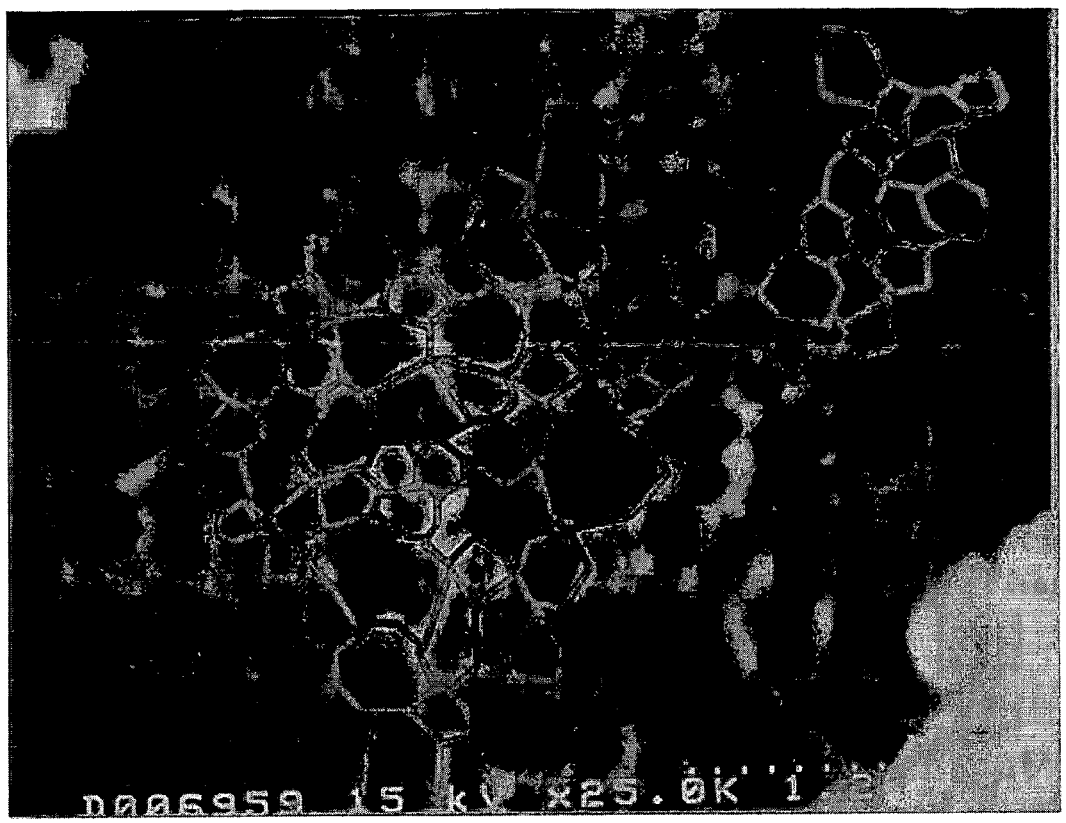
FIG. 18 is a high resolution scanning electron microscope (HRTEM) image of gallium oxide nanoweb.
Figure 19:
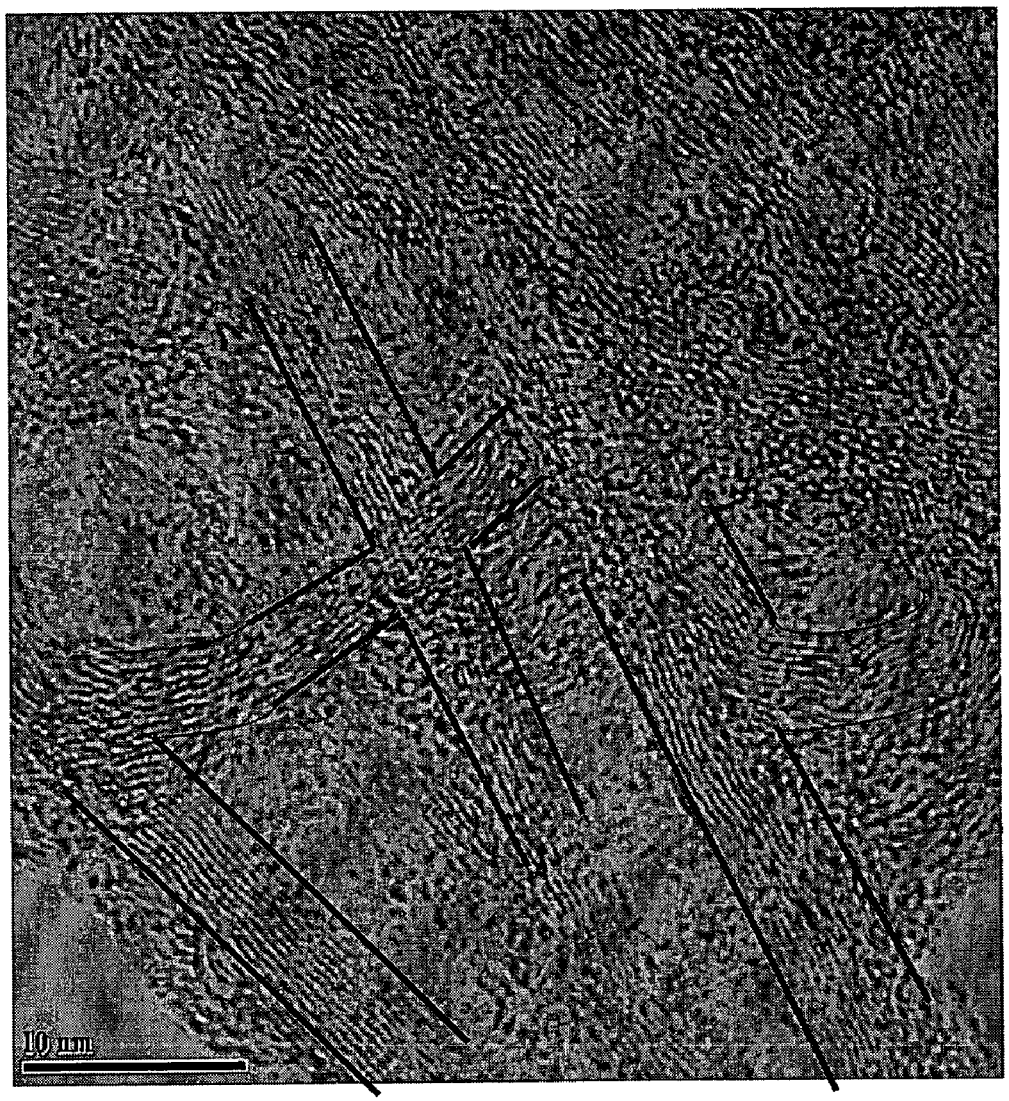
FIG. 19 is a scanning electron microscope (TEM) image of gallium oxide nanoweb.

The small clusters (<100 nm) of Ga tend to flatten out with exposure to wetting gas phase species such as nitrogen or oxygen. The nanowires nucleating from these small clusters tend to grow parallel to the substrate and physically impinge on each other. The schematic of FIG. 17 shows nanoweb formation. The studies using oxygen and hydrogen in the gas phase over small clusters of Ga over quartz substrate led to the formation of two-dimensional network of nanowires. The individual segments of the network were on the order of few nm (<10 nm). The entire process is rapid and takes place within few minutes over large areas. The gallium oxide nanoweb is shown as a high-resolution WEM image and high-resolution TEM image as shown in FIGS. 18 and 19, respectively.

It is contemplated that electrical contacts can be formed to large area nanowire networks and used for sensors (tin oxide and zinc oxide). It is expected that the performance of a mono-layer nanowire network would mimic that of a single nanowire and junctions between single crystal nanowires. In addition, these nanowire networks are extremely interesting for large area photo-catalysts for hydrogen generation if they can be made out of titania and tin-oxide.

Zn/ZnO system are expected to behave in a similar manner to that of Ga/gallium oxide, i.e., hydrogen and oxygen plasma exposure over a Zn droplet covered substrate will lead to tin-oxide nanowire network. In the case of titania, it is contemplated that a Ti cluster covered surface and exposure to hydrogen and oxygen from the gas phase for multiple nucleation and coalescence of titania nanowires would form the titania nanoweb.

Figure 20:
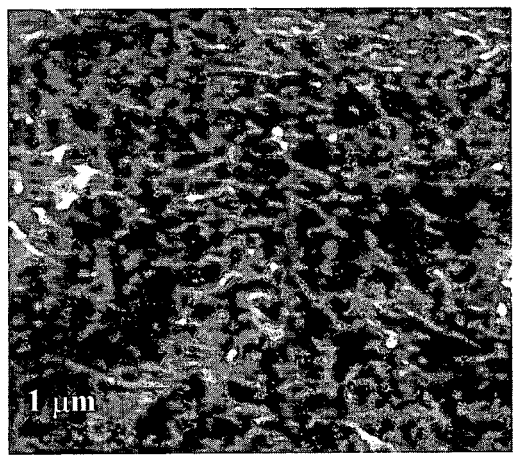
FIG. 20 is a scanning electron microscope microphotograph of titania nanowires produced with activated oxygen exposure onto metallic titanium substrate at a temperature of 500 degrees Celsius taken at 1 µm.
Figure 21:
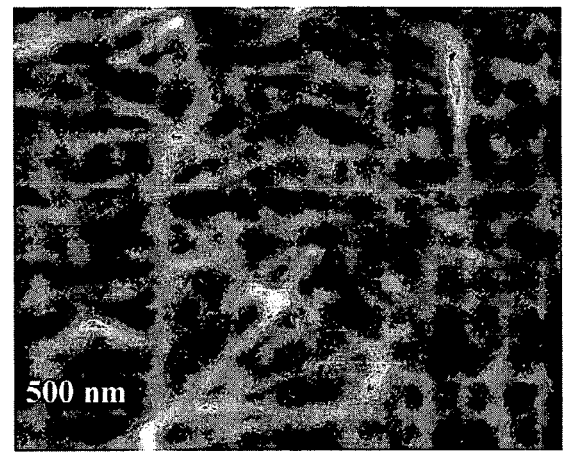
FIG. 21 is a scanning electron microscope microphotograph of titania nanowires produced with activated oxygen exposure onto metallic titanium substrate at a temperature of 500 degrees celsius taken at 500 nm.

Experiments were performed using chemical vapor transport experiments in argon/oxygen environments with titanium metal as the source and quartz as substrate at a temperature range of 500-700 C. Similarly, experiments were performed with titanium substrates exposed directly to oxygen atmosphere at 550 C. Both experiments produced titania nanowires (<50 nm diameter and >10 microns long as shown in FIGS. 20 and 21 which depict SEM photographs of titania nanowires produced with activated oxygen exposure onto metallic titanium substrate at a temperature of 500 degrees centigrade. The results lend credibility to nanoweb creation using oxygen/hydrogen plasma exposure onto titanium droplet covered substrates.

These networks are formed with great consistency and the spatial limitation of the network assembly depends solely on the plasma reactor dimensions. The process concept is easily scaleable to produce nanoweb coatings over large areas by spraying a plasma torch for hydrogen and oxygen over metal droplet covered substrates. The large surface to volume ratios and single crystal nature of the individual wires that make up the framework of the webs suggest novel applications for catalysis and for sensing—distinctive from bulk materials. The two dimensional network-nature of the nanowebs inspires novel material positioning techniques for ultra-small sensors and 2 dimensional surfaces of solar cells.

Means for Activating Gas Phase:

The gas phase for production of nanoweb networks in accordance with the present invention can be activated using many means in addition to microwave plasmas: thermal by heating the gas phase in excess of 800 C; Radio-frequency plasmas using 13.76 MHz frequency at powers ranging from 50-500 W at pressures ranging from 30 m Torr-30 Torr; and using a heated tungsten filament (or tantalum) at 1600 C or higher at distances from the substrate ranging from 1 mm to 15 mm.

Means for Preparing Metal Droplets on the Substrate:

Metal oxide particles can be applied onto the substrate through dip coating, ultrasonication, spraying or sol-gel techniques. In this procedure, the first step will be to reduce the metal oxide particles to metal using hydrogen plasma. Metal droplets can be applied onto the substrate using various means such as sputtering metal or evaporation of metal. In this case, the process step for reduction using hydrogen should not be used as the metal droplets could agglomerate into large droplets leading to random growth of metal oxide nanowires.

The foregoing detailed description is given primarily for clearness of understanding and no unnecessary limitations are to be understood therefrom, for modification will become obvious to those skilled in the art upon reading this disclosure and may be made upon departing from the spirit of the invention and scope of the appended claims. Accordingly, this invention is not intended to be limited by the specific exemplifications presented hereinabove. Rather, what is intended to be covered is within the spirit and scope of the appended claims.

We claim:

1. A process of synthesizing low melting metal nanowebs, comprising:
    forming a catalytic metal on a substrate;
    placing the combination in a pressure chamber;
    adding gaseous reactant;
    applying sufficient microwave energy to raise the temperature in the chamber to a point above the melting point of the metal and continuing the process forming a of thin film with nm-sized $Ga_{(1)}$ droplets;
    decreasing the surface tension of $Ga_{(1)}$ droplets in the mixed plasma, allowing the metal to wet the substrate surface whereby forming flattened Ga discs;
    re-oxidation of $Ga_{(1)}$ in the presence of reactive H/O-Pl and preferential growth of nanowires from Ga discs parallel to the substrate;
    molecular assembly into nanotubular structures; and
    spatial guidance of nanowires to grow toward each other.

2. A process of synthesizing two dimensional networks of metal oxide systems comprising:
    forming thin metal oxide particles on a substrate;
    placing the combination in a low pressure chamber;
    adding an appropriate gaseous reactant;
    raising substrate temperature to appropriate temperatures;
    applying sufficient activation to the gas phase (heating or excitation using either microwaves,
    radio-frequency plasmas or hot-filaments forming metal droplets on a substrate using either sputtering or evaporation of metal onto substrate;
    decreasing the surface tension of metal droplets in the mixed plasma using appropriate combination of gases;
    continue oxidation with the appropriate gaseous combination involving hydrogen and oxygen continue growth of nanowires from small metal droplets parallel to the substrate until metal is consumed; and
    coalescence of nanowires to form networks or two dimensional nanowires (nanoweb).

3. A process of synthesizing two dimensional networks of metal oxide systems comprising:
    forming thin metal oxide particles on a substrate;
    placing the combination in a low pressure chamber;
    adding an appropriate gaseous reactant;
    raising substrate temperature to appropriate temperatures;
    applying sufficient activation to the gas phase (heating or excitation using either microwaves, radio-frequency plasmas or hot-filaments) to reduce small metal droplets on the substrate;
    decreasing the surface tension of metal droplets in the mixed plasma using appropriate combination of gases;
    continuing oxidation with the appropriate gaseous combination involving hydrogen and oxygen;
    continuing growth of nanowires from small metal droplets parallel to the substrate until metal is consumed; and
    coalescence of nanowires to form networks or two dimensional nanowires (nanoweb).

4. A process of thickening nanowire networks of metal oxide systems comprising:
    forming non-uniform sized metal droplets on a substrate;
    placing the combination in a low pressure chamber;
    adding appropriate combinations of gaseous reactants;
    raising the substrate temperature to appropriate values;
    activating the gas phase with either microwaves or hot-filaments or simply heating;
    continue oxidation until all metal is consumed;
    forming multiple layers of nanowire networks increasing the thickness and overall surface area.

5. The process of claim 1, wherein said substrate is selected from the group consisting of silicon, carbon, quartz, alumina, pyrolytic boron nitride, glassy carbon, polycrystalline diamond film, porous graphite, sapphire and combinations thereof.

6. The process of claim 1, further comprising the step of said nanowires intersecting and forming webs parallel to said substrate.

7. The process of claim 1, including the step of said metal droplets melting in said plasma providing a solvent medium for bulk nucleation and growth of said nanowires.

8. The process of claim 1, comprising the step of said thin film spreading on said substrate initiating nucleation with densities greater than $10^{11}/cm^2$.

9. The process of claim 1, including the step of manipulating the absolute size, composition, and crystallinity of the nanowires using gas phase chemistry.

10. The process of claim 1, including the step of controlling the surface dynamics of nuclei on said metal surface defining the pattern formation and the time of coalescence to determine the morphology of the resulting structure.

11. The process of claim 1, including the step of controlling nucleation and growth of a metal oxide crust on a molten metal surface forming multiple nucleation and growth of noncatalytic low melting metal nanostructures creating crystalline metal oxide nanowires devoid of any structural defects.

12. The process of claim 1, including the step of nucleation of said metal occurring upon a smooth liquid surface forming an oxide layer as an amorphous film on said surface in the presence of hydrogen and oxygen in the gas phase.

13. The process of claim 1, including the step of forming said nanoweb in the presence of an abundance of said metal forming a layer by layer growth.

14. The process of claim 1, including the step of creating continuous oxidation-reduction reactions forming spontaneous self-organization of adjacent particles forming wires and joining of said wires at a planar interface.

15. The process of claim 1, wherein the step of applying oxygen from the vapor phase as a gaseous reactant forms surface adsorbed species on a molten metal surface creating oxygenated metal species, dissolving said oxygenated metal species into a bulk melt, phase segregating said oxygenated metal species in said bulk melt creating multiple nuclei on a molten metal surface aggregating and forming a polycrystalline crust on the molten metal surface, controlling application of hydrogen/oxygen gaseous reactants enabling nuclei segregation on said molten metal surface thereby preventing complete crust formation and promoting growth of nuclei in one dimension upon basal attachment.

16. The process of claim 1, wherein said nanowires comprise a material having a low solubility and a low wetting characteristic with respect to said melting metal.

17. The process of claim 1 further comprising the step of growing said nanowires from 20 to 100 nanometers thick and from ten to at least a hundred microns in length.

18. The process of claim 1, including the step of producing nanowire segments having a diameter from between 1 to 1000 nanometers and a length of from 10 to 100 microns.

19. The process of claim 1, including the step of forming regular polygonal networks from $100/cm^2$ to $10^{10}/cm^2$.

20. The process of claim 1 including the step of forming a network having a thickness in a range of from 20 to 1000 nanometers.

21. The process of claim 1 including the step of forming a network over an area ranging from 500 ·500 nanometers to several square meters.

22. The process of claim 1, including the step of controlling the metal droplet size to less than 50 nanometers in a continuous oxidation reduction process forming nanotube nanowebs.

23. The process of claim 1, including the step of applying said microwave energy in a power range of from 600 to 1200 W at a pressure of 30 to 60 Torr.

24. The process of claim 2, wherein said low melting metals and their oxides are selected from group consisting of gallium, gallium oxide, zinc oxide, indium, tin, zinc, tin oxide, aluminum, aluminum oxide, bismuth oxide, titanium dioxide, and combinations thereof.

25. The process of claim 2, wherein said substrate is selected from the group consisting of silicon, carbon, quartz, alumina, pyrolytic boron nitride, glassy carbon, polycrystalline diamond film, porous graphite, sapphire and combinations thereof.

26. The process of claim 2, further comprising the step of said nanowires intersecting and forming webs parallel to said substrate.

27. The process of claim 2, wherein said webs comprise two-dimensional polygonal arrangements of said nanowires.

28. The process of claim 2, including the step of said metal droplets melting in said plasma providing a solvent medium for bulk nucleation and growth of said nanowires.

29. The process of claim 2, comprising the step of said thin film spreading on said substrate initiating nucleation with densities greater than $10^{11}/cm^2$.

30. The process of claim 2, including the step of manipulating the absolute size, composition, and crystalliity of the nanowires using gas phase chemistry.

31. The process of claim 2, including the step of controlling the surface dynamics of nuclei on said metal surface defining the pattern formation and the time of coalescence to determine the morphology of the resulting structure.

32. The process of claim 2, including the step of controlling nucleation and growth of a metal oxide crust on a molten metal surface forming multiple nucleation and growth of noncatalytic low melting metal nanostructures creating crystalline metal oxide nanowires devoid of any structural defects.

33. The process of claim 2 including the step of controlling the plasma uniformity over a molten metal surface tuning the resulting one-dimensional morphology.

34. The process of claim 2, including the step of nucleation of said metal occurring upon a smooth liquid surface forming an oxide layer as an amorphous film on said surface in the presence of hydrogen and oxygen in the gas phase.

35. The process of claim 2, including the step of forming said nanoweb in the presence of an abundance of said metal forming a layer by layer growth.

36. The process of claim 2, including the step of creating continuous oxidation-reduction reactions forming spontaneous self-organization of adjacent particles forming wires and joining of said wires at a planar interface.

37. The process of claim 2, wherein the step of applying oxygen from the vapor phase as a gaseous reactant forms surface adsorbed species on a molten metal surface creating oxygenated metal species, dissolving said oxygenated metal species into a bulk melt, phase segregating said oxygenated metal species in said bulk melt creating multiple nuclei on a molten metal surface aggregating and forming a polycrystalline crust on the molten metal surface, controlling application of hydrogen/oxygen gaseous reactants enabling nuclei segregation on said molten metal surface thereby preventing complete crust formation and promoting growth of nuclei in one dimension upon basal attachment.

38. The process of claim 2, wherein said nanowires comprise a material having a low solubility and a low wetting characteristic with respect to said melting metal.

39. The process of claim 2 further comprising the step of growing said nanowires from 20 to 100 nanometers thick and from ten to at least a hundred microns in length.

40. The process of claim 2, including the step of producing nanowire segments having a diameter from between 1 to 1000 nanometers and a length of from 10 to 100 microns.

41. The process of claim 2, including the step of forming regular polygonal networks from $100/cm^2$ to $10^{10}/cm^2$.

42. The process of claim 2 including the step of forming a network having a thickness in a range of from 20 to 1000 nanometers.

43. The process of claim 2 including the step of forming a network over an area ranging from 500 ·500 nanometers to several square meters.

44. The process of claim 2, including the step of controlling the metal droplet size to less than 50 nanometers in a continue oxidation reduction process forming nanotube nanowebs.

45. The process of claim 2, including the step of applying said microwave energy in a power range of from 600 to 1200 W at a pressure of 30 to 60 Torr.

46. The process of claim 3, wherein said low melting metals and their oxides are selected from group consisting of gallium, gallium oxide, zinc oxide, indium, tin, zinc, tin oxide, aluminum, aluminum oxide, bismuth oxide, titanium dioxide, and combinations thereof.

47. The process of claim 3, wherein said substrate is selected from the group consisting of silicon, carbon, quartz, alumina, pyrolytic boron nitride, glassy carbon, polycrystalline diamond film, porous graphite, sapphire and combinations thereof.

48. The process of claim 3, further comprising the step of said nanowires intersecting and forming webs parallel to said substrate.

49. The process of claim 3, wherein said webs comprise two-dimensional polygonal arrangements of said nanowires.

50. The process of claim 3, including the step of said metal droplets melting in said plasma providing a solvent medium for bulk nucleation and growth of said nanowires.

51. The process of claim 3, comprising the step of said thin film spreading on said substrate initiating nucleation with densities greater than $10^{11}/cm^2$.

52. The process of claim 3, including the step of manipulating the absolute size, composition, and crystallinity of the nanowires using gas phase chemistry.

53. The process of claim 3, including the step of controlling the surface dynamics of nuclei on said metal surface defining the pattern formation and the time of coalescence to determine the morphology of the resulting structure.

54. The process of claim 3, including the step of controlling nucleation and growth of a metal oxide crust on a molten metal surface forming multiple nucleation and growth of noncatalytic low melting metal nanostructures creating crystalline metal oxide nanowires devoid of any structural defects.

55. The process of claim 3 including the step of controlling the plasma uniformity over a molten metal surface tuning the resulting one-dimensional morphology.

56. The process of claim 3, including the step of nucleation of said metal occurring upon a smooth liquid surface forming an oxide layer as an amorphous film on said surface in the presence of hydrogen and oxygen in the gas phase.

57. The process of claim 3, including the step of forming said nanoweb in the presence of an abundance of said metal forming a layer by layer growth.

58. The process of claim 3, including the step of creating continuous oxidation-reduction reactions forming spontaneous self-organization of adjacent particles forming wires and joining of said wires at a planar interface.

59. The process of claim 3, wherein the step of applying oxygen from the vapor phase as a gaseous reactant forms surface adsorbed species on a molten metal surface creating oxygenated metal species, dissolving said oxygenated metal species into a bulk melt, phase segregating said oxygenated metal species in said bulk melt creating multiple nuclei on a molten metal surface aggregating and forming a polycrystalline crust on the molten metal surface, controlling application of hydrogen/oxygen gaseous reactants enabling nuclei segregation on said molten metal surface thereby preventing complete crust formation and promoting growth of nuclei in one dimension upon basal attachment.

60. The process of claim 3, wherein said nanowires comprise a material having a low solubility and a low wetting characteristic with respect to said melting metal.

61. The process of claim 3 further comprising the step of growing said nanowires from 20 to 100 nanometers thick and from ten to at least a hundred microns in length.

62. The process of claim 3, including the step of producing nanowire segments having a diameter from between 1 to 1000 nanometers and a length of from 10 to 100 microns.

63. The process of claim 3, including the step of forming regular polygonal networks from $100/cm^2$ to $10^{10}/cm^2$.

64. The process of claim 3 including the step of forming a network having a thickness in a range of from 20 to 1000 nanometers.

65. The process of claim 3 including the step of forming a network over an area ranging from 500 ·500 nanometers to several square meters.

66. The process of claim 3, including the step of controlling the metal droplet size to less than 50 nanometers in a continue oxidation reduction process forming nanotube nanowebs.

67. The process of claim 3, including the step of applying said microwave energy in a power range of from 600 to 1200 W at a pressure of 30 to 60 Torr.

68. The process of thickening NANOWIRE networks of metal oxide systems of claim 4 including the step of controlling the ratio of reductant to oxidant in the gas phase (plasma).

69. The process of thickening NANOWIRE networks of metal oxide systems of claim 4 including the step of controlling the concentration of reactive hydrogen atoms produced in the plasma.

70. The process of thickening NANOWIIRE networks of metal oxide systems of claim 4 including the step of controlling the temperature of the vessel thereby controlling the surface diffusion rate of metal atoms and size of resulting nanowires.

71. The process of thickening NANOWIRE networks of metal oxide systems of claim 4 including the step of controlling the size distribution and density of created metal droplets.

* * * * *

UNITED STATES PATENT AND TRADEMARK OFFICE
CERTIFICATE OF CORRECTION

PATENT NO. : 7,445,671 B2 Page 1 of 1
APPLICATION NO. : 10/869489
DATED : November 4, 2008
INVENTOR(S) : Sunkara et al.

It is certified that error appears in the above-identified patent and that said Letters Patent is hereby corrected as shown below:

IN THE CLAIMS:

Claim 21, col. 17, line 45: Change "500· 500" to "500 × 500"

Claim 43, col. 18, line 62: Change "500· 500" to "500 × 500"

Claim 65, col. 20, line 28: Change "500· 500" to "500 × 500"

Signed and Sealed this

Thirtieth Day of December, 2008

JON W. DUDAS
*Director of the United States Patent and Trademark Office*